US010886346B2

(12) United States Patent
Kim

(10) Patent No.: US 10,886,346 B2
(45) Date of Patent: Jan. 5, 2021

(54) DISPLAY PANEL AND METHOD OF FABRICATING THE SAME

(71) Applicant: SAMSUNG DISPLAY CO., LTD., Yongin-Si (KR)

(72) Inventor: Namjin Kim, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/240,496

(22) Filed: Jan. 4, 2019

(65) Prior Publication Data

US 2019/0214446 A1 Jul. 11, 2019

(30) Foreign Application Priority Data

Jan. 5, 2018 (KR) ........................ 10-2018-0001884

(51) Int. Cl.

*H01L 27/32* (2006.01)
*H01L 27/12* (2006.01)
*H01L 51/52* (2006.01)
*H01L 51/56* (2006.01)

(52) U.S. Cl.

CPC ...... *H01L 27/3258* (2013.01); *H01L 27/1248* (2013.01); *H01L 27/3262* (2013.01); *H01L 51/5256* (2013.01); *H01L 51/56* (2013.01); *H01L 27/3246* (2013.01); *H01L 2227/323* (2013.01); *H01L 2251/566* (2013.01)

(58) Field of Classification Search

CPC ............. H01L 27/3258; H01L 51/5243; H01L 51/5246; H01L 27/3244–3279

See application file for complete search history.

(56) References Cited

U.S. PATENT DOCUMENTS

| | | | | |
|---|---|---|---|---|
| 9,356,256 | B2 | 5/2016 | Choi | |
| 9,905,629 | B2 | 2/2018 | Kim et al. | |
| 9,905,801 | B2 | 2/2018 | Kim | |
| 10,504,859 | B2 * | 12/2019 | Zhu | H01L 23/585 |
| 2015/0060786 | A1 * | 3/2015 | Kwak | H01L 51/5253 257/40 |

(Continued)

FOREIGN PATENT DOCUMENTS

| | | |
|---|---|---|
| KR | 10-2016-0114251 A | 10/2016 |
| KR | 10-2016-0133614 A | 11/2016 |

(Continued)

*Primary Examiner* — Stephen M Bradley

(74) *Attorney, Agent, or Firm* — Lewis Roca Rothgerber Christie LLP

(57) ABSTRACT

A display panel may include an insulating substrate having a display region and a peripheral region adjacent to the display region; a plurality of insulating layers on the insulating substrate; a pixel on the display region, the pixel including a thin-film transistor and an organic light emitting device connected to the thin-film transistor; and a crack dam on the peripheral region and spaced apart from the pixel. The crack dam may be disposed adjacent to one of side surfaces of the insulating substrate extending in a first direction. The crack dam may include a plurality of insulating patterns, which are extended in the first direction and are spaced apart from each other in a second direction crossing the first direction, and a plurality of conductive patterns, which are disposed to fill gap regions between the insulating patterns.

16 Claims, 23 Drawing Sheets

(56) References Cited

U.S. PATENT DOCUMENTS

| | | | | |
|---|---|---|---|---|
| 2016/0218305 | A1* | 7/2016 | Kim | G02F 1/133305 |
| 2016/0285044 | A1 | 9/2016 | Park et al. | |
| 2017/0110532 | A1 | 4/2017 | Kim et al. | |
| 2017/0117502 | A1 | 4/2017 | Park | |
| 2018/0166525 | A1* | 6/2018 | Kim | H01L 51/0031 |
| 2019/0207160 | A1* | 7/2019 | Wang | H01L 51/5256 |

FOREIGN PATENT DOCUMENTS

| | | | |
|---|---|---|---|
| KR | 10-2017-0045459 | A | 4/2017 |
| KR | 10-2017-0047452 | A | 5/2017 |
| KR | 10-2017-0115177 | A | 10/2017 |

* cited by examiner

DISPLAY PANEL AND METHOD OF FABRICATING THE SAME

CROSS-REFERENCE TO RELATED APPLICATION

This application claims priority to and the benefit of Korean Patent Application No. 10-2018-0001884, filed on Jan. 5, 2018, in the Korean Intellectual Property Office, the entire content of which is hereby incorporated by reference.

BACKGROUND

1. Field

The present disclosure relates to a display panel and a method of fabricating the same, and in particular, to a highly reliable display panel and a method of fabricating the same.

2. Description of the Related Art

A display panel includes a display region, in which pixels are disposed, and which is utilized to display an image. If electrical signals are applied to the pixels, the pixels emit light, which constitutes an image, in respond to the applied electrical signals. The display panel may be exposed to various external impacts, during a process of fabricating or utilizing the display panel. For example, impact to be exerted on an outer portion of the display panel may be transmitted to the display region. As a result, some of the pixels in the display region may be damaged, thereby causing failure of the display panel.

SUMMARY

An aspect according to an embodiment of the inventive concept is directed toward a display panel, whose usage reliability and process reliability are improved, and a method of fabricating the display panel. In addition, an aspect according to an embodiment of the inventive concept is directed toward a display panel with a reduced bezel region and a method of fabricating the display panel.

According to an embodiment of the inventive concept, a display panel may include an insulating substrate having a display region and a peripheral region adjacent to the display region; a plurality of insulating layers on the insulating substrate; a pixel on the display region, the pixel including a thin-film transistor and an organic light emitting device connected to the thin-film transistor; and a crack dam on the peripheral region and spaced apart from the pixel, the crack dam being adjacent to one of side surfaces of the insulating substrate extending in a first direction. The crack dam may include a plurality of insulating patterns extending in the first direction and spaced apart from each other in a second direction crossing the first direction, and a plurality of conductive patterns filling gap regions between the insulating patterns.

In an embodiment, the conductive patterns may be extended in the first direction and may be spaced apart from each other in the second direction.

In an embodiment, each of the conductive patterns may be configured to connect adjacent insulating patterns to each other.

In an embodiment, the thin-film transistor may include a semiconductor pattern, a control electrode spaced apart from the semiconductor pattern and overlapping the semiconductor pattern when viewed in a plan view, an input electrode spaced apart from the control electrode and coupled to a portion of the semiconductor pattern, and an output electrode spaced apart from the control electrode and coupled to an opposite portion of the semiconductor pattern. The conductive patterns may include a same material as at least one of the control electrode, the input electrode, and the output electrode.

In an embodiment, the insulating layers may include a first insulating layer between the semiconductor pattern and the control electrode and a second insulating layer between the control electrode and the input electrode. The insulating patterns may be on a same layer as at least one of the first insulating layer and the second insulating layer.

In an embodiment, each of the insulating patterns may have a double-layered structure.

In an embodiment, the display panel may further include a base layer between the thin-film transistor and the insulating substrate. The base layer may include at least one of a barrier layer and a buffer layer, and the insulating patterns may be on a same layer as the base layer.

In an embodiment, the insulating patterns may be spaced apart from the base layer in the second direction.

In an embodiment, one of the conductive patterns may be disposed to connect one of the insulating patterns to the base layer.

In an embodiment, the insulating patterns may be connected to at least a portion of the base layer.

In an embodiment, the insulating patterns may include a plurality of first insulating patterns spaced apart from each other in the second direction, and a plurality of second insulating patterns spaced apart from each other in the second direction and located on a layer different from the first insulating patterns.

In an embodiment, the display panel may further include an encapsulation layer on the display region and configured to cover the pixel. The encapsulation layer may be extended to cover the crack dam and in contact with the insulating patterns and the conductive patterns.

In an embodiment, each of the insulating patterns and the conductive patterns may include an inorganic material.

According to an embodiment of the inventive concept, a method of fabricating a display panel may include forming pixels on a mother substrate, the mother substrate having a plurality of display regions and a peripheral region, the pixels being on each of the display regions and including a thin-film transistor and an organic light emitting device connected to the thin-film transistor, the thin-film transistor including a semiconductor pattern, a control electrode, an input electrode, and an output electrode; forming a plurality of crack dams on the peripheral region to be adjacent to the display regions, respectively; and cutting the mother substrate along a cutting line defined between the display regions to form a plurality of display panels. The forming of the crack dams may include forming a plurality of insulating patterns arranged in a first direction and filling gap regions between the insulating patterns with a conductive material to form a plurality of conductive patterns.

In an embodiment, the conductive patterns may be formed concurrently with the control electrode.

In an embodiment, the conductive patterns may be formed concurrently with the input electrode and the output electrode.

In an embodiment, the cutting of the mother substrate may be performed utilizing a laser beam.

According to an embodiment of the inventive concept, a display panel may include an insulating substrate having a display region, a peripheral region adjacent to the display region, and a side surface extending in a first direction; a pixel on the display region, the pixel including a thin-film transistor and an organic light emitting device connected to the thin-film transistor; an encapsulation layer configured to cover the pixel and including an inorganic layer and an organic layer; and a crack dam on the peripheral region, adjacent to the side surface, and extending in the first direction. The crack dam may include a plurality of inorganic insulating patterns extending in the first direction and spaced apart from each other in a second direction crossing the first direction, and a plurality of conductive patterns between the inorganic insulating patterns, configured to connect adjacent ones of the inorganic insulating patterns to each other, and spaced apart from each other in the second direction.

In an embodiment, the inorganic layer of the encapsulation layer may be configured to cover the crack dam. The organic layer of the encapsulation layer may be spaced apart from the crack dam, when viewed in a plan view.

In an embodiment, the inorganic insulating patterns may include a plurality of insulating patterns on different layers, and the inorganic layer of the encapsulation layer may have a stepwise shape on the crack dam.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
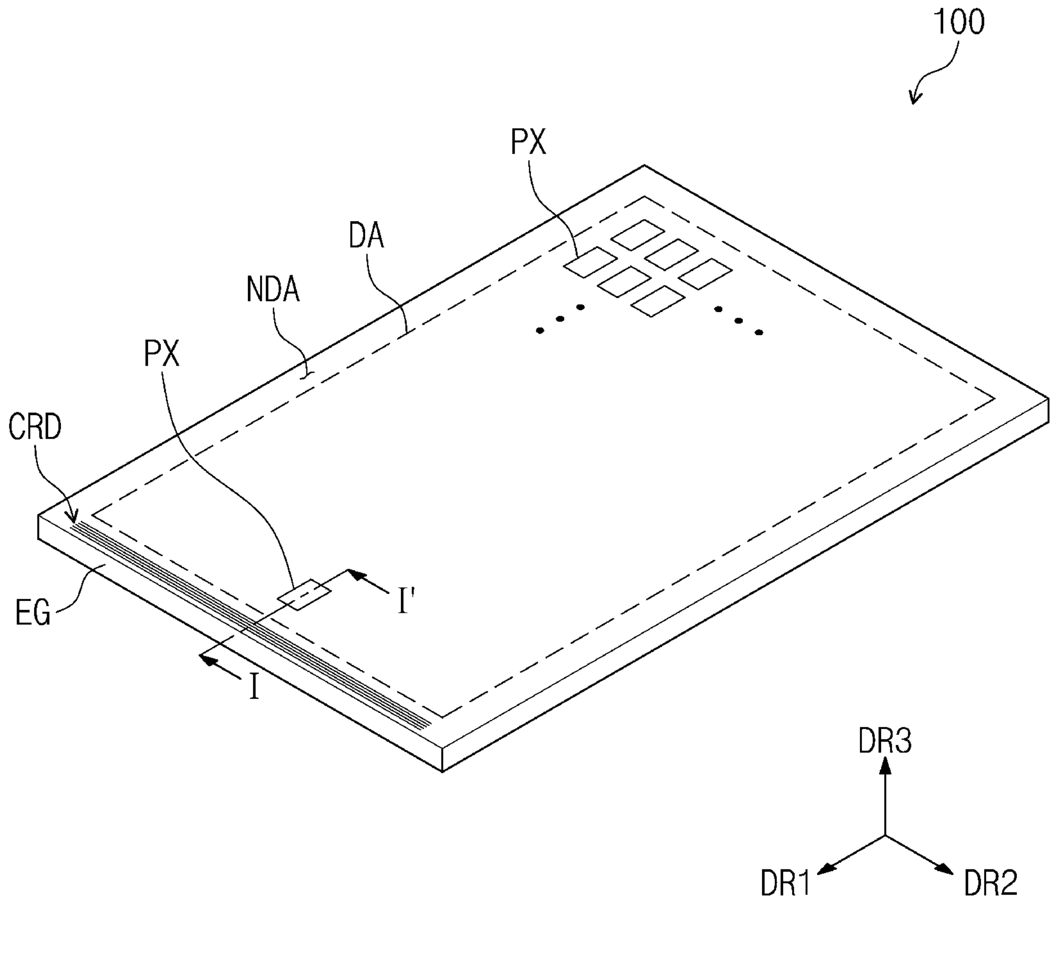
FIG. 1 is a perspective view schematically illustrating a display panel according to an embodiment of the inventive concept.

It should be noted that these figures are intended to illustrate the general characteristics of methods, structure and/or materials utilized in certain example embodiments and to supplement the written description disposed below. These drawings, however, may not be drawn to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concept will now be described more fully with reference to the accompanying drawings, in which example embodiments are shown. Example embodiments of the inventive concept may, however, be embodied in many different forms and should not be construed as being limited to the embodiments set forth herein; rather, these embodiments are disposed so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will not be repeated.

It will be understood that when an element is referred to as being "connected" or "coupled" to another element, it can be directly connected or coupled to the other element, or intervening elements may be present. In contrast, when an element is referred to as being "directly connected" or "directly coupled" to another element, there are no intervening elements present. Like numbers indicate like elements throughout.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (e.g., rotated 90 degrees or at other orientations) and the spatially relative descriptors used herein may be interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Figure 2A:
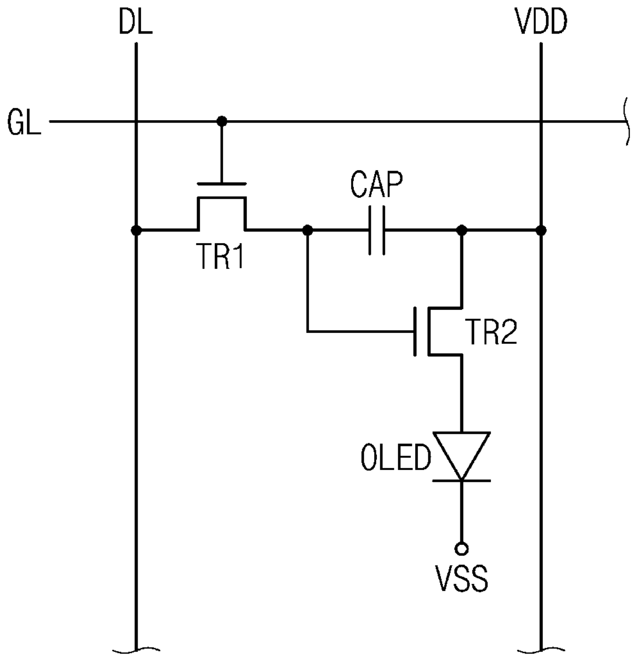
FIG. 2A is an equivalent circuit diagram illustrating a portion of a display panel shown in FIG. 1.
Figure 2B:
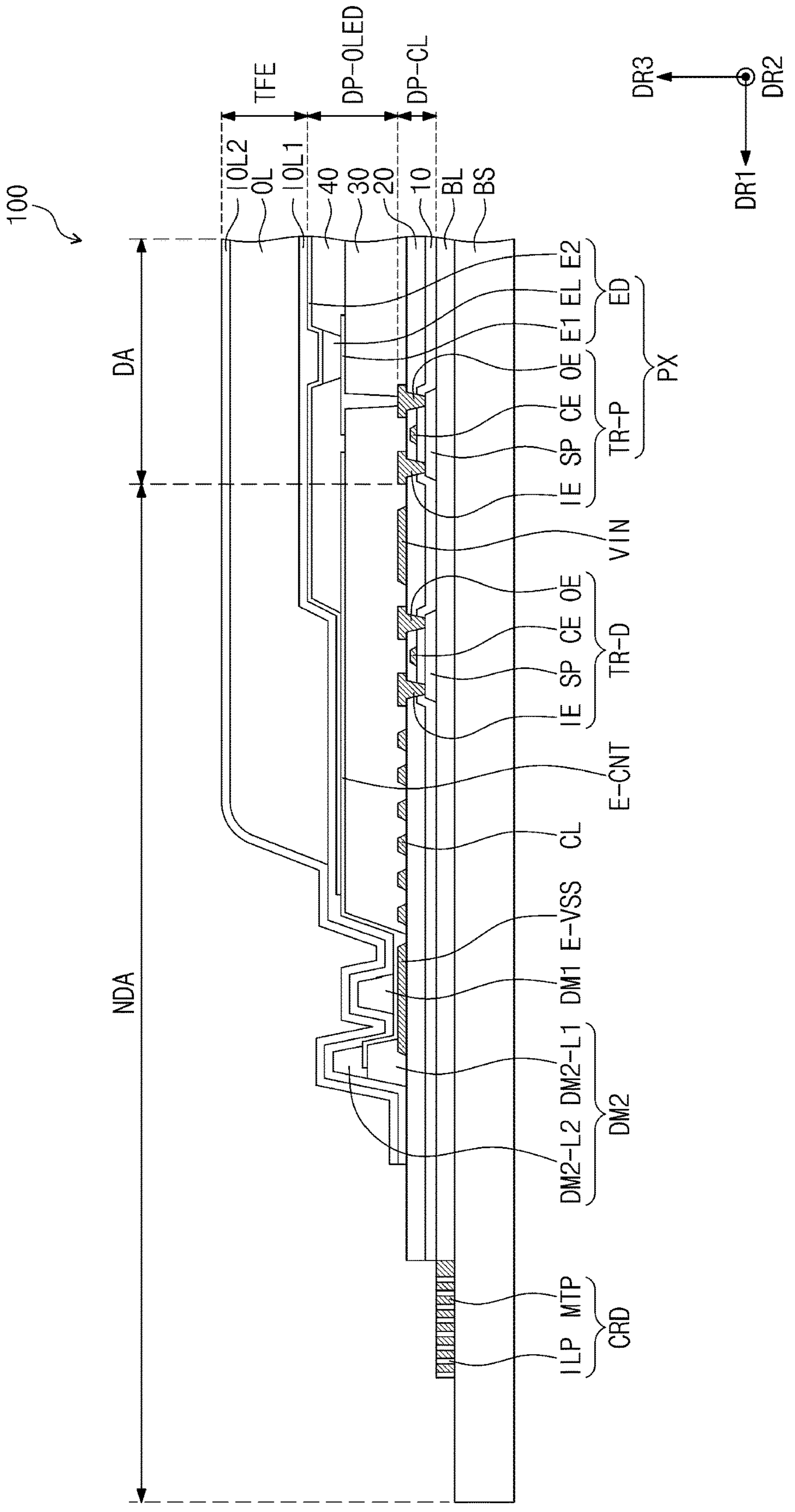
FIG. 2B is a sectional view taken along the line I-I' of FIG. 1.
Figure 2C:
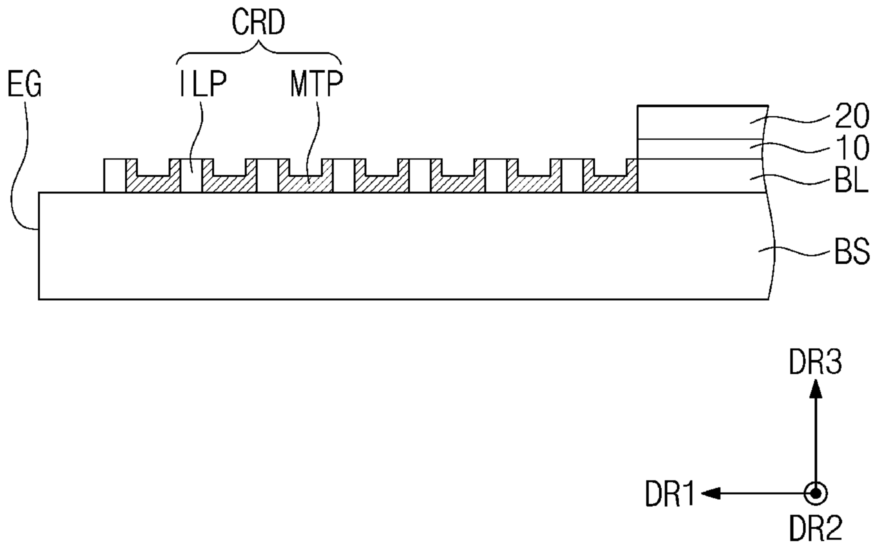
FIG. 2C is an enlarged sectional view illustrating a portion of FIG. 2B.

FIG. 1 is a perspective view schematically illustrating a display panel according to an embodiment of the inventive concept. FIG. 2A is an equivalent circuit diagram illustrating a portion of a display panel shown in FIG. 1. FIG. 2B is a sectional view taken along the line I-I' of FIG. 1. FIG. 2C is an enlarged sectional view illustrating a portion of FIG. 2B. For convenience of illustration, FIG. 2C is prepared to illustrate an enlarged shape of a region with a crack dam CRD. An embodiment of the inventive concept will be described with reference to FIGS. 1 to 2C.

A display panel 100 may include an insulating substrate BS, a base layer BL, a circuit layer DP-CL, a display device layer DP-OLED, an encapsulation layer TFE, and a crack dam CRD. The insulating substrate BS may be formed of or include an insulating material. The insulating substrate BS may be formed to have a flexible property. For example, the insulating substrate BS may include polyimide (PI). However, the inventive concept is not limited to this example, and in certain embodiments, the insulating substrate BS may be formed of or include at least one of glass or plastic materials.

The insulating substrate BS may include a display region DA and a peripheral region NDA. The display region DA may be a region of the display panel 100, which is utilized to display an image. A plurality of pixels PX may be disposed on the display region DA.

The peripheral region NDA may be located adjacent to the display region DA. The peripheral region NDA is illustrated to have a frame shape surrounding the display region DA. However, the inventive concept is not limited to this example, and in certain embodiments, the peripheral region NDA may be locally disposed at one of edge regions of the display region DA. For convenience in illustration, some of elements constituting the display panel 100 (e.g., some pixels PX and the crack dam CRD) are exemplarily illustrated in FIG. 1.

The pixels PX may be arranged to be spaced apart from each other in a first direction DR1 and a second direction DR2. For convenience in illustration, FIG. 2A illustrates an equivalent circuit diagram of one of the pixels PX as an example. However, the inventive concept is not limited to this example, and in certain embodiments, the structure of the pixel PX may be variously changed.

As shown in FIG. 2A, the pixel PX may include a first thin-film transistor TR1, a capacitor CAP, a second thin-film transistor TR2, and an organic light emitting device OLED. The first thin-film transistor TR1 may be utilized as a switching device controlling a switching (i.e., on/off) operation of a first pixel PX1. For example, the first thin-film transistor TR1 may be utilized to transmit a data signal from a second signal line DL to the capacitor Cap or the second transistor TR2 or to prevent (e.g., cut off) such transmission of the data signal, in response to a scan signal transmitted through.

The capacitor CAP may be connected to the first thin-film transistor TR1 and a first power line VDD. The capacitor CAP may be charged to have a charge amount corresponding to a difference in voltage level between the data signal transmitted from the first thin-film transistor TR1 and a first power voltage applied to the first power line VDD.

The second thin-film transistor TR2 may be connected to the first thin-film transistor TR1, the capacitor CAP, and the organic light emitting device OLED. The second thin-film transistor TR2 may be utilized to control a driving current flowing through the organic light emitting device OLED, depending on an amount of electric charges stored in the capacitor CAP. A length in time of a turn-on period of the second thin-film transistor TR2 may be dependent on an amount of electric charges stored in the capacitor CAP. During the turn-on period, the second thin-film transistor TR2 may be utilized to supply the first power voltage, which is transmitted through the first power line VDD, to the organic light emitting device OLED.

The organic light emitting device OLED may be connected to the second thin-film transistor TR2 and a power terminal VSS. The organic light emitting device OLED may be configured to emit light whose intensity is determined by a difference in voltage level between a signal transmitted through the second thin-film transistor TR2 and a second power voltage received through the power terminal VSS. A light-emitting operation of the organic light emitting device OLED may be executed during a turn-on period of the second thin-film transistor TR2.

The organic light emitting device OLED may be formed of or include a light-emitting material. The organic light emitting device OLED may be configured to generate light, whose color is determined by the light-emitting material. Color of light generated by the organic light emitting device OLED may be one of red, green, blue, and white.

In FIG. 2B, some of the elements constituting the pixel PX (e.g., a thin-film transistor TR-P (hereinafter, a pixel transistor) and an organic light emitting device ED) are illustrated as an example. As shown in FIG. 2B, the pixel transistor TR-P may be disposed on the insulating substrate BS.

The pixel transistor TR-P may constitute (e.g., may be a constituent of) the circuit layer DP-CL. In the present embodiment, the display panel 100 may further include the base layer BL disposed between the circuit layer DP-CL and the insulating substrate BS. The base layer BL may include a single insulating layer or a plurality of insulating layers. For example, the base layer BL may include at least one of a buffer layer or a barrier layer. Thus, it may be possible to stably form the circuit layer DP-CL on the base layer BL and to prevent or substantially prevent oxygen or moisture, which may enter through the insulating substrate BS or the insulating substrate BS, from infiltrating into the circuit layer DP-CL.

The pixel transistor TR-P may include a semiconductor pattern SP, a control electrode CE, an input electrode IE, and an output electrode OE. The control electrode CE of the pixel transistor TR-P may be spaced apart from the semiconductor pattern SP with a first insulating layer 10 interposed therebetween. The control electrode CE may be connected to the first thin-film transistor TR1 of FIG. 2A. The first insulating layer 10 may be utilized as a gate insulating layer.

The input and output electrodes IE and OE of the pixel transistor TR-P may be spaced apart from the control electrode CE of the pixel transistor TR-P with a second insulating layer 20 interposed therebetween. The input and output electrodes IE and OE of the pixel transistor TR-P may be disposed to penetrate the first and second insulating layers 10 and 20, and may be respectively coupled to two separate region of the semiconductor pattern SP. The input electrode IE of the pixel transistor TR-P may be connected to the capacitor CAP of FIG. 2A, and the output electrode OE of the pixel transistor TR-P may be connected to the organic light emitting device ED.

Meanwhile, in the pixel transistor TR-P, the control electrode CE may be disposed below the semiconductor pattern SP, or the input and output electrodes IE and OE may be disposed below the semiconductor pattern SP. Alternatively, the input and output electrodes IE and OE may be disposed on the same layer as the semiconductor pattern SP, and may be directly coupled to the semiconductor pattern SP. According to an embodiment of the inventive concept, the structure of the pixel transistor TR-P may be variously changed, but the inventive concept is not limited thereto.

The organic light emitting device ED may be disposed on a third insulating layer 30. The organic light emitting device ED and a fourth insulating layer 40 may constitute the display device layer DP-OLED. The organic light emitting device ED may include a first electrode E1, a light emitting layer EL, and a second electrode E2, which are sequentially stacked in a third direction DR3.

The first electrode E1 may be coupled to the pixel transistor TR-P through the third insulating layer 30. Although not shown, an additional connection electrode may be further disposed between the first electrode E1 and the pixel transistor TR-P, and in this case, the first electrode E1 may be electrically coupled to the pixel transistor TR-P through a connection electrode.

The fourth insulating layer 40 may be disposed on the third insulating layer 30. The fourth insulating layer 40 may be disposed to have an opening. The opening may be disposed to expose at least a portion of the first electrode E1. The fourth insulating layer 40 may serve as a pixel definition layer.

The light emitting layer EL may be disposed on the first electrode E1. The light emitting layer EL may be formed of or include a light-emitting material. For example, the light emitting layer EL may be formed of or include at least one of fluorescent or phosphorescent materials. The light emitting layer EL may be configured to emit red, green, or blue light, in response to a potential difference between the first electrode E1 and the second electrode E2.

The second electrode E2 may be disposed on the light emitting layer EL. The second electrode E2 may be disposed to face the first electrode E1. The second electrode E2 may be connected to the second power terminal VSS of FIG. 2A. The organic light emitting device ED may receive the second power voltage through the second electrode E2.

The second electrode E2 may be formed of or include a transparent conductive material or a transflective conductive material. Thus, light generated by the light emitting layer EL may easily pass through the second electrode E2 and may propagate in the third direction DR3. However, the inventive concept is not limited to this example, and in certain embodiments, the organic light emitting device ED may be configured to have a back-side emission structure, in which the first electrode E1 includes a transparent or transflective material, or a double-sided emission structure, which is configured to allow light to be emitted through top and bottom surfaces thereof.

Although not shown, the organic light emitting device ED may further include at least one organic layer, which is disposed between the light emitting layer EL and the first electrode E1 or between the light emitting layer EL and the second electrode E2. The organic layer may be utilized to control flow of electric charges, which are supplied from the first electrode E1 and the second electrode E2 to the light emitting layer EL, and this may make it possible to improve optical characteristics and lifespan of the organic light emitting device ED.

The encapsulation layer TFE may be disposed on the organic light emitting device ED to encapsulate the organic light emitting device ED. Although not shown, a capping layer covering the second electrode E2 may be further disposed between the second electrode E2 and the encapsulation layer TFE.

The encapsulation layer TFE may include a first inorganic layer IOL1, an organic layer OL, and a second inorganic layer IOL2, which are sequentially stacked in the third direction DR3. However, the inventive concept is not limited thereto, and in certain embodiments, the encapsulation layer TFE may further include a plurality of inorganic layers and a plurality of organic layers.

The first inorganic layer IOL1 may be disposed to cover a second electrode ED2. The first inorganic layer IOL1 may prevent or substantially prevent external moisture or oxygen from infiltrating into the organic light emitting device ED. For example, the first inorganic layer IOL1 may be formed of or include at least one of silicon nitride or silicon oxide. The first inorganic layer IOL1 may be formed by a deposition process.

The organic layer OL may be disposed on the first inorganic layer IOL1 to be in contact with the first inorganic layer IOL1. The organic layer OL may be configured to improve a non-uniform surface profile caused by the first inorganic layer IOL1. For example, the organic layer OL may be disposed to cover the first inorganic layer IOL1 having an uneven top surface or particles on the first inorganic layer IOL1, and this may make it possible to prevent or substantially prevent the non-uniform surface profile of the first inorganic layer IOL1 or the particles from affecting elements on the organic layer OL. In addition, the organic layer OL may be configured to relieve stress between layers that are in contact with each other. The organic layer OL may be formed of or include an organic material and may be formed by a solution-based film-forming process (e.g., a spin coating process, a slit coating process, or an inkjet process).

The second inorganic layer IOL2 may be disposed on the organic layer OL to cover the organic layer OL. By virtue of the organic layer OL having a relatively flat top surface, it may be possible to more stably form the second inorganic layer IOL2, compared to the case of forming it on the first inorganic layer IOL1. The second inorganic layer IOL2 may be configured to encapsulate the organic layer OL. The second inorganic layer IOL2 may be formed of or include at least one of silicon nitride or silicon oxide. The second inorganic layer IOL2 may be formed by a deposition process.

Although not shown, an input sensing unit including a plurality of sensor patterns may be further disposed on the encapsulation layer TFE. The input sensing unit may be directly formed on the encapsulation layer TFE and may be utilized to sense an external input such as a touch event or a pressure event. However, the inventive concept is not limited to this example, and in certain embodiments, the structure of the display panel may be variously changed.

The display panel 100 may further include a thin-film transistor TR-D (hereinafter, a driving transistor), conductive patterns E-VSS, E-CNT, VIN, and CL, and dam portions DM1 and DM2, which are disposed on the peripheral region NDA.

The driving transistor TR-D may constitute the circuit layer DP-CL. In the present embodiment, the driving transistor TR-D may have a structure corresponding to that of the pixel transistor TR-P. For example, the driving transistor TR-D may include the semiconductor pattern SP disposed on the base layer BL, the control electrode CE disposed on the first insulating layer 10, and the input and output electrodes IE and OE disposed on the second insulating layer 20. Accordingly, the pixel transistor TR-P and the driving transistor TR-D may be concurrently (e.g., simultaneously) formed by the same process, and thus, it may be possible to simplify a fabrication process and to reduce a process cost. However, the inventive concept is not limited to this example, and in certain embodiments, the driving transistor TR-D may have a structure different from that of the pixel transistor TR-P.

The conductive patterns E-VSS, E-CNT, VIN, and CL may include a power supplying line E-VSS, a connection electrode E-CNT, an initializing voltage line VIN, and a signal line CL. The power supplying line E-VSS may correspond to a power terminal of the pixel PX. Thus, the power supplying line E-VSS may be utilized to supply the second power voltage to the organic light emitting device ED. In the present embodiment, the second power voltage PX may be supplied in common to a plurality of the pixels.

The power supplying line E-VSS, which is a part of the circuit layer DP-CL, may be disposed on the second insulating layer 20. The power supplying line E-VSS and the input or output electrode IE or OE of the driving transistor TR-D may be simultaneously or concurrently formed by the same process. However, the inventive concept is not limited to this example, and in certain embodiments, the power supplying line E-VSS may be formed by a process different from that for the input or output electrode IE or OE and may be disposed on a layer different from that under the input or output electrode IE or OE.

The connection electrode E-CNT may be disposed on the third insulating layer 30 to constitute the display device layer DP-OLED. The connection electrode E-CNT may be electrically coupled to the power supplying line E-VSS. The connection electrode E-CNT may be extended from the top surface of the third insulating layer 30 to cover a top surface of the power supplying line E-VSS exposed by the third insulating layer 30.

The second electrode E2 of the organic light emitting device ED may be extended from the display region DA and may be coupled to the connection electrode E-CNT. The connection electrode E-CNT may receive the second power voltage from the power supplying line E-VSS. Accordingly, the second power voltage may be transmitted to the second electrode E2 through the connection electrode E-CNT and may be disposed (e.g., transmitted) to each of the pixels.

The connection electrode E-CNT may be disposed on the same layer as the first electrode E1 of the organic light emitting device ED and may be formed concurrently with the first electrode E1. However, the inventive concept is not limited to this example, and in certain embodiments, the connection electrode E-CNT may be disposed on a layer different from that (i.e., a layer) under the first electrode E1.

In an embodiment, a plurality of the signal lines CL may be disposed on the second insulating layer 20. The signal lines CL may be spaced apart from each other in the first direction DR1 and may be utilized to independently transmit electrical signals.

The initializing voltage line VIN may be utilized to provide an initializing voltage to the pixel PX. The initializing voltage line VIN may be coupled to a plurality of pixels, respectively, and may be utilized to provide the initializing voltage to each of the pixels. In the present embodiment, the signal line CL and the initializing voltage line VIN may be formed on the same layer and concurrently (e.g., simultaneously) by the same process. However, the inventive concept is not limited to this example, and in certain embodiments, the signal line CL and the initializing voltage line VIN may be independently formed through different processes.

The dam portions DM1 and DM2 may prevent or substantially prevent the organic layer OL from being formed outside of the dam portions DM1 and DM2, when the organic layer OL of the encapsulation layer TFE is formed on the display region DA. The dam portions DM1 and DM2 may be disposed near at least one of the edge regions of the display region DA. The dam portions DM1 and DM2 may be disposed to enclose the display region DA, when viewed in a plan view. The dam portions DM1 and DM2 may include a plurality of dam portions (e.g., a first dam portion DM1 and a second dam portion DM2).

The first dam portion DM1 may be disposed closer to the display region DA than the second dam portion DM2. The first dam portion DM1 may be overlapped with the power supplying line E-VSS, when viewed in a plan view. In the present embodiment, the connection electrode E-CNT may include a portion that is disposed between the first dam portion DM1 and the power supplying line E-VSS, when viewed in a sectional view.

In the present embodiment, the first dam portion DM1 may be formed of or include the same material as the fourth insulating layer 40 and may be concurrently (e.g., simultaneously) formed utilizing the same mask as that for the fourth insulating layer 40. In this case, an additional process for forming the first dam portion DM1 may be omitted, and this may make it possible to simplify the fabrication process and to reduce the process cost.

The second dam portion DM2 may be disposed at a relatively outer region, compared with the first dam portion DM1. The second dam portion DM2 may be disposed to cover a portion of the power supplying line E-VSS. In an embodiment, the second dam portion DM2 may have a double-layered structure including a first layer DM2-L1 and a second layer DM2-L2. For example, the first layer DM2-L1 and the third insulating layer 30 may be formed at the same time (e.g., concurrently), and the second layer DM2-L2 and the fourth insulating layer 40 may be formed at the same time (e.g., concurrently). Accordingly, it may be possible to easily form the second dam portion DM2, without an additional process.

In the present embodiment, the connection electrode E-CNT may be disposed on the first layer DM2-L1 of the second dam portion DM2 to be overlapped with a portion of the first layer DM2-L1. For example, the connection electrode E-CNT may include an end portion that is interposed between the first layer DM2-L1 and the second layer DM2-L2. However, the inventive concept is not limited to this example, and in certain embodiments, the connection electrode E-CNT may not be extended to the second dam portion DM2.

The first inorganic layer IOL1 and the second inorganic layer IOL2 may be extended from the display region DA to an outer region of the second dam portion DM2. Thus, the first inorganic layer IOL1 and the second inorganic layer IOL2 may cover the first dam portion DM1 and the second dam portion DM2. The organic layer OL may be located within an internal region beyond (e.g., away from) the second dam portion DM2.

The crack dam CRD may be disposed on the peripheral region NDA. Referring to FIGS. 1 to 2C, the crack dam CRD may be disposed on the peripheral region NDA to be adjacent to an edge EG of the insulating substrate BS. For convenience in illustration, in FIGS. 2B and 2C, one of the side surfaces of the insulating substrate BS is illustrated as the edge EG, and one crack dam CRD adjacent to the edge EG is illustrated. However, the inventive concept is not limited to this example, and in certain embodiments, a plurality of the crack dams CRD may be disposed adjacent to two or more of the side surfaces of the insulating substrate BS.

The crack dam CRD may be extended in an extension direction of the edge EG adjacent thereto. In an embodiment, the extension direction of the edge EG may be parallel to the second direction DR2, and thus, the crack dam CRD may be extended in the second direction DR2. The crack dam CRD may include a plurality of inorganic insulating patterns ILP and a plurality of conductive patterns MTP.

The inorganic insulating patterns ILP may be arranged to be spaced apart from each other in the first direction DR1. In an embodiment, gap regions may be defined between the inorganic insulating patterns ILP. Each of the inorganic insulating patterns ILP may be a line-shaped structure extending in the second direction DR2. The inorganic insulating patterns ILP may be arranged in the first direction DR1 to be parallel to each other.

The inorganic insulating patterns ILP may prevent or substantially prevent impact, which is exerted through the edge EG from the outside, or the consequent crack from being transferred or expanded to elements (e.g., the driving transistor TR-D, the pixel transistor TR-P, or the organic light emitting device ED) constituting the display panel 100. The inorganic insulating patterns ILP may be spaced apart from each other in the first direction DR1, thereby preventing or substantially preventing impact or crack from being transferred or expanded in the first direction DR1. Accordingly, it may be possible to improve the reliability of the display panel 100.

The conductive patterns MTP may be disposed in gap regions, respectively, which are defined between the inorganic insulating patterns ILP. For example, the conductive patterns MTP may be disposed to fill the gap regions. Thus, each of the conductive patterns MTP may have a shape corresponding to a corresponding one of the gap regions. In the present embodiment, each of the conductive patterns MTP may be a line-shaped structure extending in the second direction DR2.

In the present embodiment, the conductive patterns MTP may be arranged to be spaced apart from each other in the first direction DR1. Each of the conductive patterns MTP may be disposed to be in direct contact with an adjacent corresponding pair of the inorganic insulating patterns ILP. For example, each of the conductive patterns MTP may be disposed to cover opposite side surfaces of an adjacent corresponding pair of the inorganic insulating patterns ILP and a top surface of the insulating substrate BS between the adjacent corresponding pair of the inorganic insulating patterns ILP. The inorganic insulating patterns ILP, which are separated from each other, may be physically connected to each other by the conductive patterns MTP.

In the present embodiment, at least a portion of the conductive patterns MTP may also be disposed to fill gap regions between the inorganic insulating patterns ILP and the base layer BL. Thus, the crack dam CRD may be disposed to be in contact with the base layer BL.

The conductive patterns MTP may be formed of or include a conductive material. For example, the conductive patterns MTP may be formed of or include the same material as the control electrode CE of the pixel transistor TR-P. Here, the conductive patterns MTP may be formed concurrently (e.g., simultaneously) by the same process as that for the control electrode CE of the pixel transistor TR-P.

The conductive patterns MTP may be formed of or include the same material as that of the input and output electrodes IE and OE of the pixel transistor TR-P. Here, the conductive patterns MTP may be formed concurrently (e.g., simultaneously) by the same process as that for the input and output electrodes IE and OE of the pixel transistor TR-P.

Accordingly, it may be possible to form the conductive patterns MTP without an additional process, and this may make it possible to simplify the fabrication process and to reduce the process cost. However, the inventive concept is not limited to this example, and in certain embodiments, the conductive patterns MTP and the pixel transistor TR-P may be independently formed through different processes.

According to an embodiment of the inventive concept, since the gap regions between the inorganic insulating patterns ILP are covered with the conductive patterns MTP, it may be possible to prevent or substantially prevent particles from entering the gap regions between the inorganic insulating patterns ILP, during a fabrication process. In addition, even when the particles enter the gap regions between the inorganic insulating patterns ILP during the fabrication process, owing to the conductive patterns MTP covering the gap regions, it may be possible to prevent or substantially prevent a process of forming the organic light emitting device ED from being affected by the particles, which remain in the gap regions between the inorganic insulating patterns ILP. Thus, it may be possible to improve process reliability of the fabrication process. This will be described in more detail below.

Figure 3A:
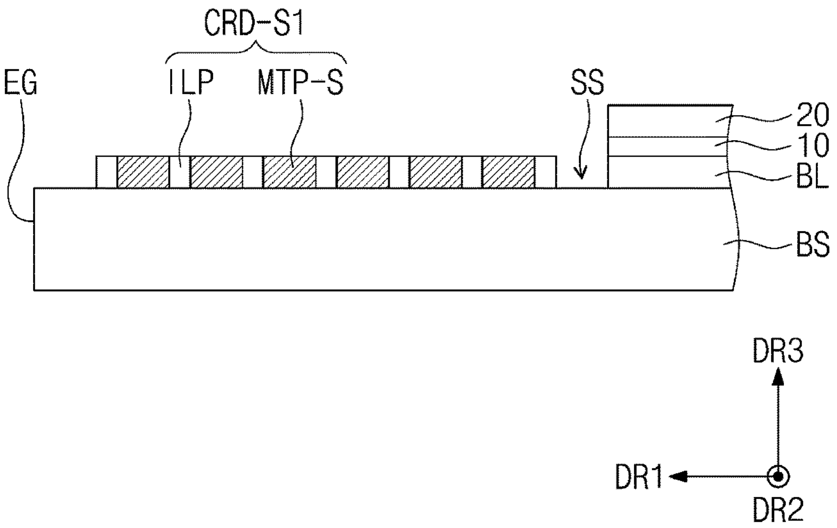
FIGS. 3A and 3B are sectional views illustrating a portion of a display panel according to an embodiment of the inventive concept.
Figure 3B:
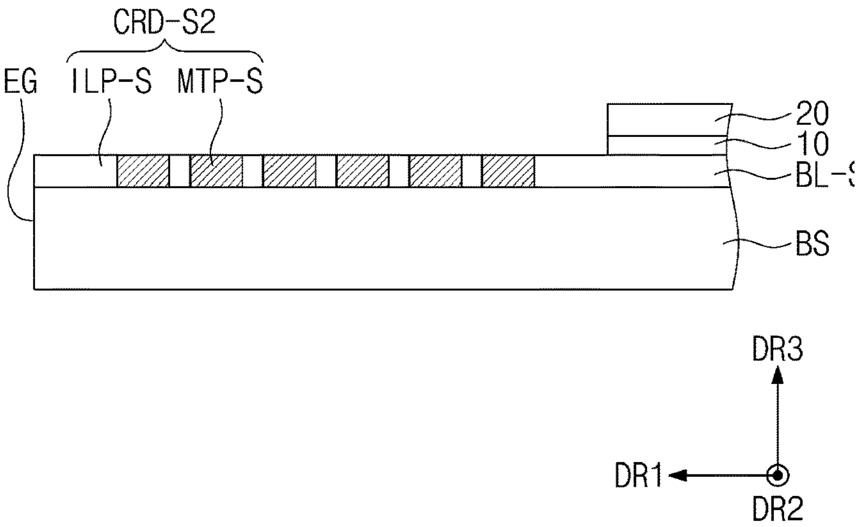

FIGS. 3A and 3B are sectional views illustrating a portion of a display panel according to an embodiment of the inventive concept. For convenience in illustration, FIGS. 3A and 3B illustrate a region corresponding to the region shown in FIG. 2C. Hereinafter, a display panel according to an embodiment of the inventive concept will be described with reference to FIGS. 3A and 3B. For concise description, an element previously described with reference to FIGS. 1 to 2C may be identified by the same reference number without repeating an overlapping description thereof.

As shown in FIG. 3A, a crack dam CRD-S1 may be disposed to be spaced apart from the base layer BL. The crack dam CRD-S1 may be spaced apart from an end portion of the base layer BL in the first direction DR1, thereby defining a gap region SS.

The crack dam CRD-S1 may include the inorganic insulating patterns ILP and conductive patterns MTP-S, which are disposed to fill gap regions between the inorganic insulating patterns ILP. The conductive patterns MTP-S may not be provided in the gap region SS between the crack dam CRD-S1 and the base layer BL. The inorganic insulating patterns ILP of the crack dam CRD-S1 may be physically separated from the base layer BL.

Alternatively, as shown in FIG. 3B, a crack dam CRD-S2 may be inserted in a base layer BL-S. The base layer BL-S may be extended to the edge EG of the insulating substrate BS, and inorganic insulating patterns ILP-S of the crack dam CRD-S2 may be formed by removing some portions of the base layer BL-S.

The conductive patterns MTP-S of the crack dam CRD-S2 may be disposed to fill gap regions between the inorganic insulating patterns ILP-S. For example, the conductive patterns MTP-S may be formed to fill the removed portions of the base layer BL-S. Accordingly, the crack dam CRD-S2 and the base layer BL-S may be formed to constitute a single object.

According to an embodiment of the inventive concept, the structure of the crack dam CRD-S1 or CRD-S2 may be variously changed, if a display panel is configured to include a plurality of insulating patterns, which are spaced apart from each other, and a plurality of conductive patterns, which are disposed to fill gap regions between the insulating patterns.

Figure 4A:
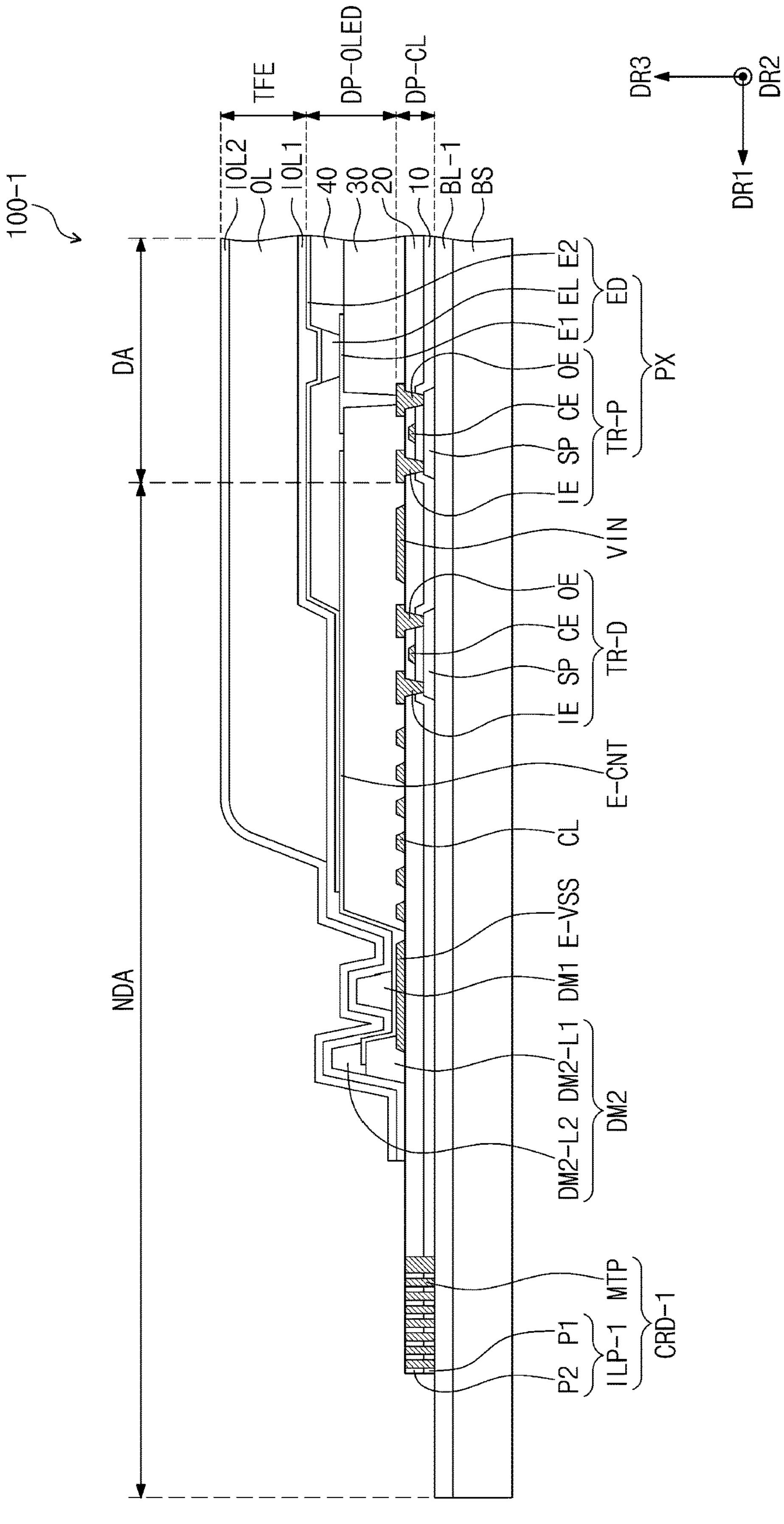
FIGS. 4A and 4B are sectional views illustrating a region of a display panel according to an embodiment of the inventive concept.
Figure 4B:
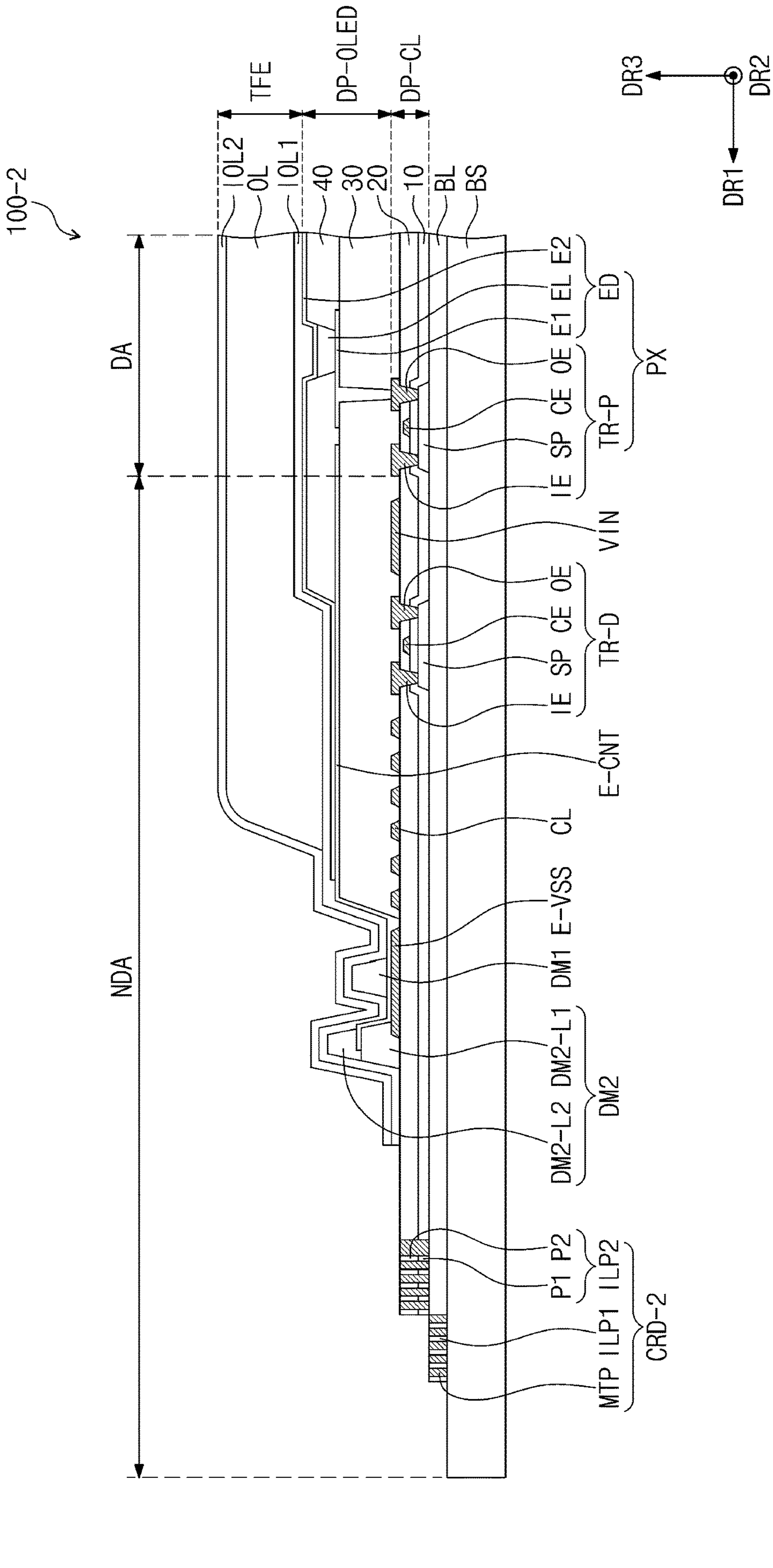

FIGS. 4A and 4B are sectional views illustrating a region of a display panel according to an embodiment of the inventive concept. For convenience in illustration, FIGS. 4A and 4B illustrate a region corresponding to the region shown in FIG. 2B. Hereinafter, a display panel according to an embodiment of the inventive concept will be described with reference to FIGS. 4A and 4B. For concise description, an element previously described with reference to FIGS. 1 to 3B may be identified by the same reference number without repeating an overlapping description thereof.

As shown in FIG. 4A, a display panel 100-1 may include a crack dam CRD-1 disposed on the base layer BL-1. The base layer BL-1 may be disposed to cover substantially the entire top surface of the insulating substrate BS and may be overlapped with all of the display region DA and the peripheral region NDA.

The crack dam CRD-1 may be disposed adjacent to end portions of the first and second insulating layers 10 and 20. The crack dam CRD-1 may include a plurality of inorganic insulating patterns ILP-1 and a plurality of the conductive patterns MTP. The inorganic insulating patterns ILP-1 may be spaced apart from the end portions of the first and second insulating layers 10 and 20, in the first direction DR1. Furthermore, the inorganic insulating patterns ILP-1 may be spaced apart from each other in the first direction DR1, thereby defining the gap regions therebetween.

Each of the inorganic insulating patterns ILP-1 may have a double-layered structure. For example, the inorganic insulating patterns ILP-1 may include a plurality of first layers P1, which extend in the second direction DR2 and are arranged in the first direction DR1, and a plurality of second layers P2, which extend in the second direction DR2 and are arranged in the first direction DR1. Each of the second layers P2 may be stacked on a corresponding one of the first layers P1.

The first layers P1 may be formed on the same layer as the first insulating layer 10. The first layers P1 may be formed of the same material as the first insulating layer 10 and may have the same thickness as the first insulating layer 10. The second layers P2 may be formed on the same layer as the second insulating layer 20. The second layers P2 may be formed of the same material as the second insulating layer 20 and may have the same thickness as the second insulating layer 20.

The conductive patterns MTP may be disposed to fill the gap regions between the inorganic insulating patterns ILP-1. Each of the conductive patterns MTP may be disposed to connect an adjacent corresponding pair of the inorganic insulating patterns ILP-1 to each other.

The conductive patterns MTP may be formed of or include a conductive material. For example, the conductive patterns MTP may include the same material as that of the input and output electrodes IE and OE of the pixel transistor TR-P. Here, the conductive patterns MTP may be formed concurrently (e.g., simultaneously) by the same process as that for the input and output electrodes IE and OE of the pixel transistor TR-P. However, the inventive concept is not limited to this example, and in certain embodiments, the conductive patterns MTP may be independently formed by a process different from that for the input and output electrodes IE and OE of the pixel transistor TR-P.

In certain embodiments, as shown in FIG. 4B, a display panel 100-2 may include inorganic insulating patterns ILP1 and ILP2, which are disposed on different layers, and a crack dam CRD-2 including the conductive patterns MTP. The inorganic insulating patterns ILP1 and ILP2 may include first inorganic insulating patterns ILP1, which are disposed on the insulating substrate BS, and second inorganic insulating patterns ILP2, which are disposed on the base layer BL.

The first inorganic insulating patterns ILP1 may be disposed on the same layer as the base layer BL and may be spaced apart from the end portion of the base layer BL. The first inorganic insulating patterns ILP1 may substantially correspond to a portion of the inorganic insulating patterns ILP shown in FIG. 2A. The conductive patterns MTP may be disposed to fill gap regions, respectively, which are formed between the first inorganic insulating patterns ILP1 and between the base layer BL and the first inorganic insulating patterns ILP1.

The second inorganic insulating patterns ILP2 may have a double-layered structure. The second inorganic insulating patterns ILP2 may include the first layers P1, which are disposed on the same layer as the first insulating layer 10, and the second layers P2, which are stacked on the first layers P1 and are disposed on the same layer as the second insulating layer 20. The second inorganic insulating patterns ILP2 may substantially correspond to a portion of the inorganic insulating patterns ILP-1 shown in FIG. 4A. The conductive patterns MTP may be disposed to fill gap regions, respectively, which are formed between the second inorganic insulating patterns ILP2, between the first insulating layer 10 and the second inorganic insulating patterns ILP2, and between the second insulating layer 20 and the second inorganic insulating patterns ILP2.

As described with reference to the crack dam CRD-1 or CRD-2 of the display panel 100-1 or 100-2, the crack dam may be disposed at any levels of the display panel 100-1 or 100-2, and this may make it possible to stably prevent or substantially prevent impact or crack from being transferred or expanded laterally in various layers. Accordingly, it may be possible to improve the reliability of the display panel 100-1 or 100-2.

Figure 5A:
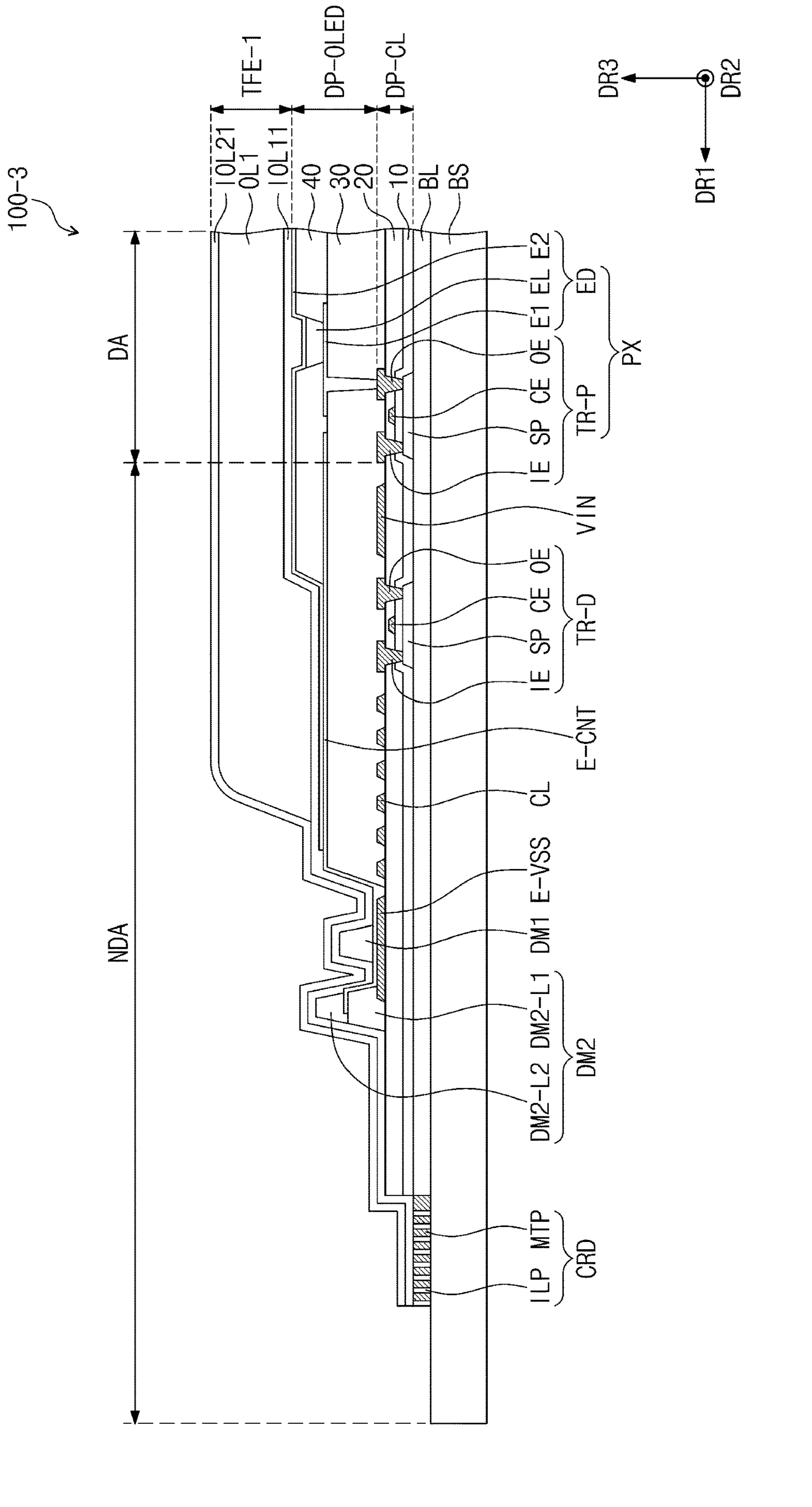
FIGS. 5A to 5C are sectional views illustrating a region of a display panel according to an embodiment of the inventive concept.
Figure 5B:
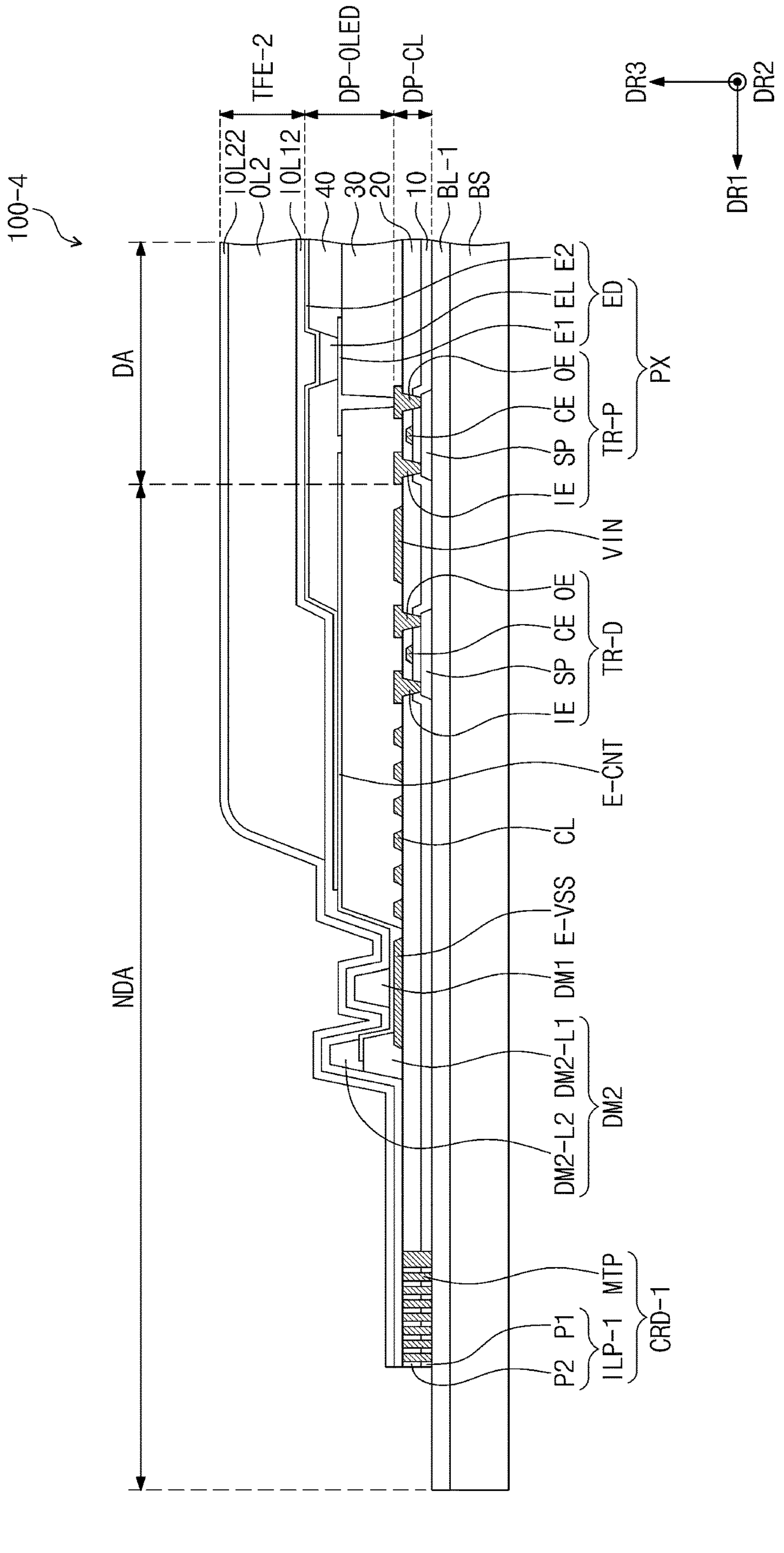
Figure 5C:
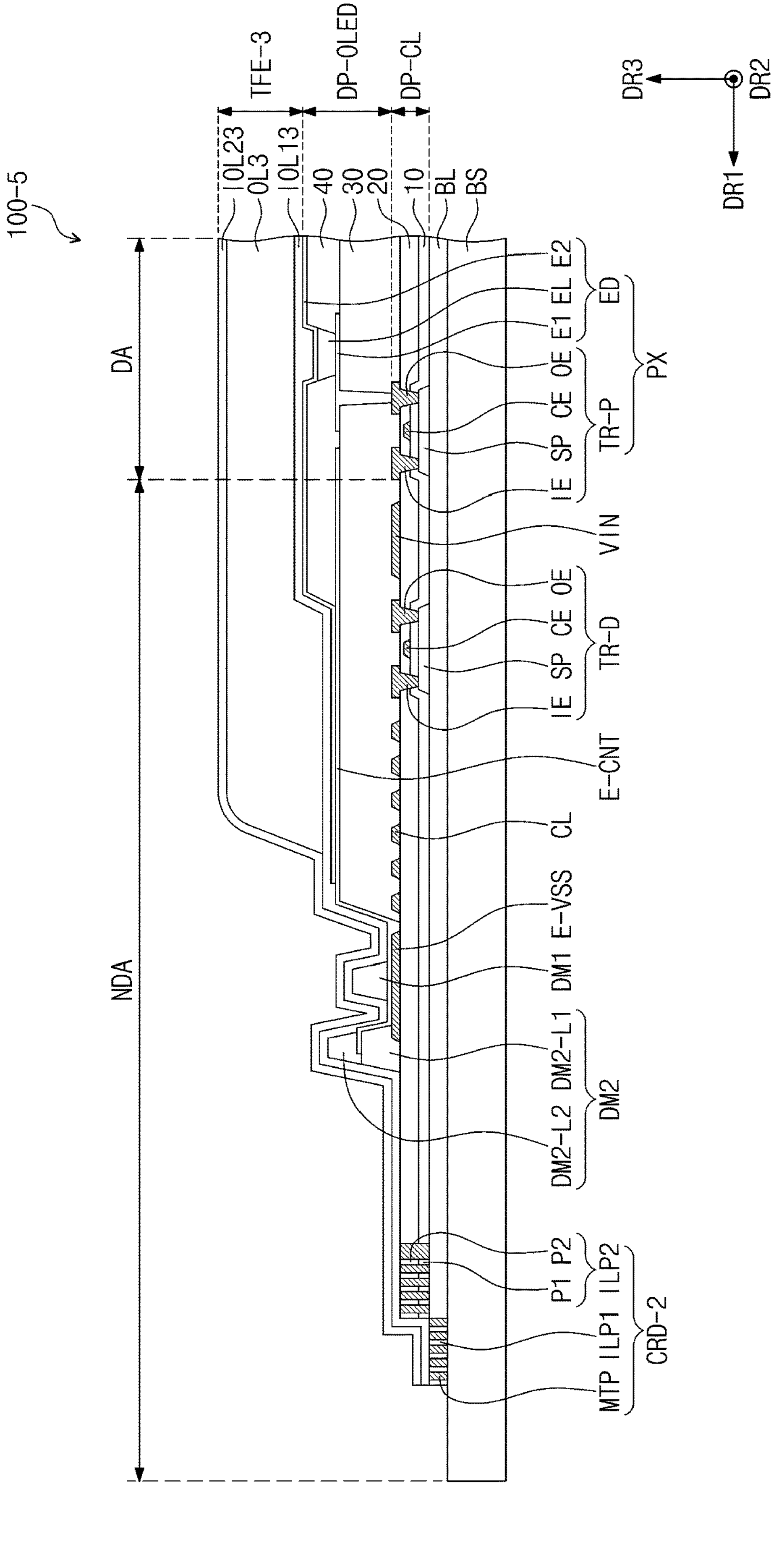

FIGS. 5A to 5C are sectional views illustrating a region of a display panel according to an embodiment of the inventive concept. For convenience in illustration, FIGS. 5A to 5C illustrate a region corresponding to the region shown in FIG. 2B. Hereinafter, a display panel according to an embodiment of the inventive concept will be described with reference to FIGS. 5A to 5C. For concise description, an element previously described with reference to FIGS. 1 to 4B may be identified by the same reference number without repeating an overlapping description thereof.

As shown in FIG. 5A, a display panel 100-3 may include an encapsulation layer TFE-1 that is extended onto the crack dam CRD. The crack dam CRD and the base layer BL may be disposed on the same layer. In the present embodiment, the crack dam CRD may correspond to the crack dam CRD shown in FIG. 2B.

The encapsulation layer TFE-1 may be overlapped with the crack dam CRD, when viewed in a plan view. An organic layer OL1 of the encapsulation layer TFE-1 may correspond to the organic layer OL shown in FIG. 2B, but the first inorganic layer IOL11 and the second inorganic layer IOL21 of the encapsulation layer TFE-1 may be extended beyond the second dam portion DM2 to cover the end portion of the second insulating layer 20, the end portion of the first insulating layer 10, and the top surface of the crack dam CRD.

The top surfaces of the inorganic insulating patterns ILP and the top surfaces of the conductive patterns MTP may be in contact with the first inorganic layer IOL11. Since the inorganic insulating patterns ILP and the conductive patterns MTP are formed of inorganic materials, the first inorganic layer IOL11 in contact with the inorganic insulating patterns ILP and the conductive patterns MTP may be tightly attached to the crack dam CRD. Accordingly, it may be possible to prevent or substantially prevent delamination of the encapsulation layer TFE-1 from occurring on the crack dam CRD and thereby to improve an encapsulation property of the encapsulation layer TFE-1.

In certain embodiments, as shown in FIG. 5B, a display panel 100-4 may include an encapsulation layer TFE-2 that is extended onto the crack dam CRD-1. The crack dam CRD-1 may be disposed on the base layer BL to have a stacked structure. In the present embodiment, the crack dam CRD-1 may correspond to the crack dam CRD-1 shown in FIG. 4A.

The encapsulation layer TFE-2 may include a first inorganic layer IOL12, a second inorganic layer IOL22, and an organic layer OL2. The organic layer OL2 may correspond to the organic layer OL shown in FIG. 4A, but the first and second inorganic layers IOL12 and IOL22 may be extended to cover the top surface of the crack dam CRD-1, which is defined by the top surfaces of the second layers P2 and the conductive patterns MTP. The inorganic insulating patterns ILP-1 and the conductive patterns MTP may have top surfaces that are in contact with the first inorganic layer IOL12.

As shown in FIG. 5C, a display panel 100-5 may include an encapsulation layer TFE-3 that is extended onto the crack dam CRD-2. The crack dam CRD-2 may include the inorganic insulating patterns ILP1 and ILP2, which are disposed on different layers. In the present embodiment, the crack dam CRD-2 may correspond to the crack dam CRD-2 shown in FIG. 4B.

The encapsulation layer TFE-3 may include a first inorganic layer IOL13, a second inorganic layer IOL23, and an organic layer OL3. The organic layer OL3 may correspond to the organic layer OL shown in FIG. 4B, but the first inorganic layer IOL13 and the second inorganic layer IOL23 may be extended to cover the top surface of the crack dam CRD-2. The first inorganic layer IOL13 and the second inorganic layer IOL23 may be disposed to cover the first inorganic insulating patterns ILP1 and the second inorganic insulating patterns ILP2 and to have a stepwise shape on the crack dam CRD-2.

In the display panel 100-3, 100-4, or 100-5 according to an embodiment of the inventive concept, the thin-film encapsulation layer TFE-1, TFE-2, or TFE-3 may be extended to the crack dam CRD, CRD-1, or CRD-2. The inorganic insulating pattern ILP, ILP1-1, ILP1, or ILP2 and the conductive patterns MTP may be formed of or include an inorganic material. Accordingly, the first inorganic layer IOL11, IOL12, or IOL13 may be tightly (e.g., strongly) attached to the crack dam CRD, CRD-1, or CRD-2. Thus, it may be possible to prevent or substantially prevent delamination of the encapsulation layer TFE-1, TFE-2, or TFE-3 from occurring on the crack dam CRD, CRD-1, or CRD-2 and thereby to improve an encapsulation property of the encapsulation layer TFE-1, TFE-2, or TFE-3.

According to an embodiment of the inventive concept, since the encapsulation layer TFE-1, TFE-2, or TFE-3 is disposed to cover the crack dam CRD, CRD-1, or CRD-2, it may be possible to form the crack dam CRD, CRD-1, or CRD-2 without providing an additional region for the crack dam CRD, CRD-1, or CRD-2 outside the encapsulation layer TFE-1, TFE-2, or TFE-3. Accordingly, a distance from the end portion of the insulating substrate BS to the encapsulation layer TFE may be reduced, and thus, it may be possible to reduce an area of the peripheral region NDA and to reduce an area of a bezel region in the display panel 100-3, 100-4, or 100-5.

Figure 6A:
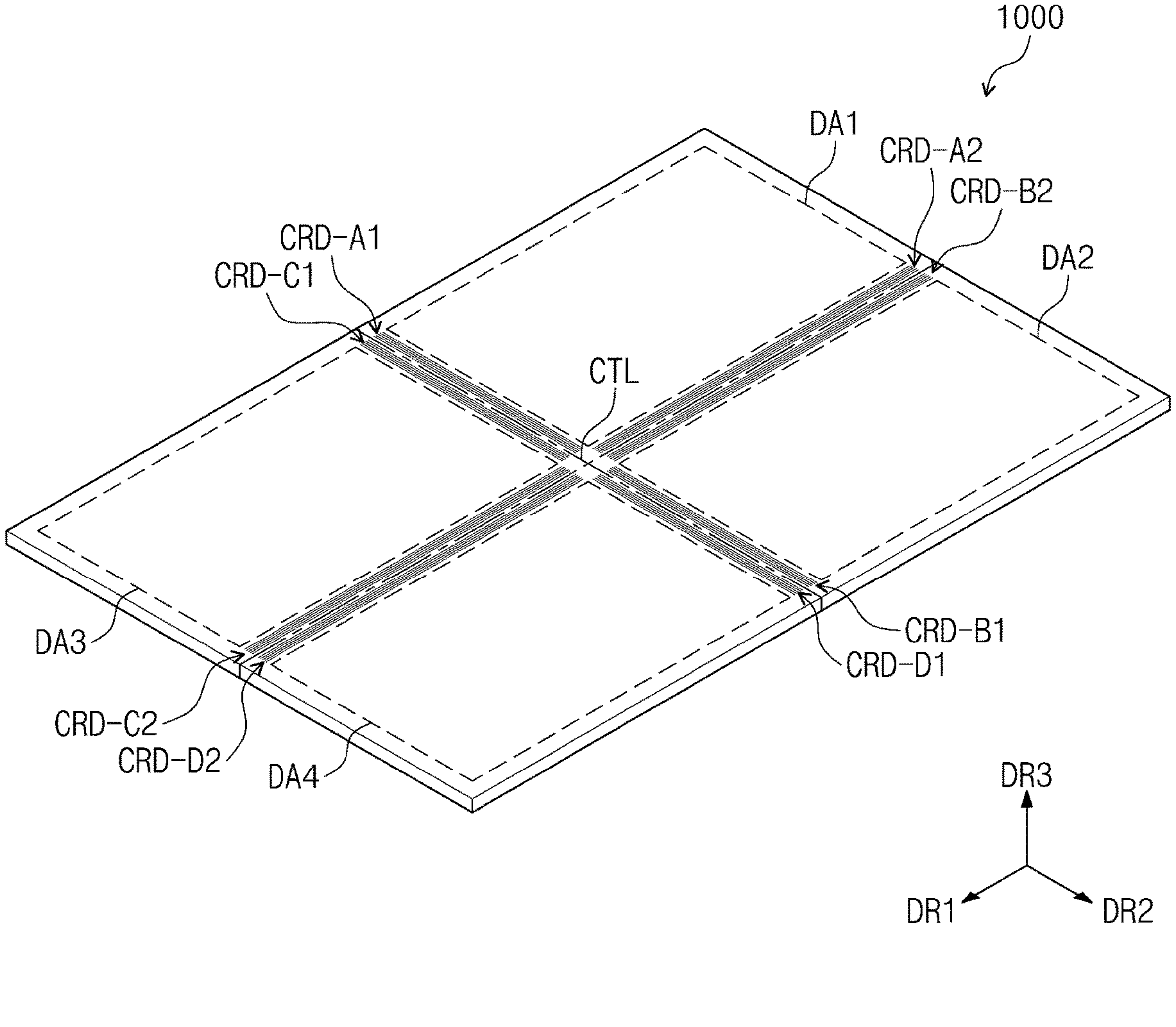
FIGS. 6A to 6C are schematic perspective views illustrating a method of fabricating a display panel according to an embodiment of the inventive concept.
Figure 6B:
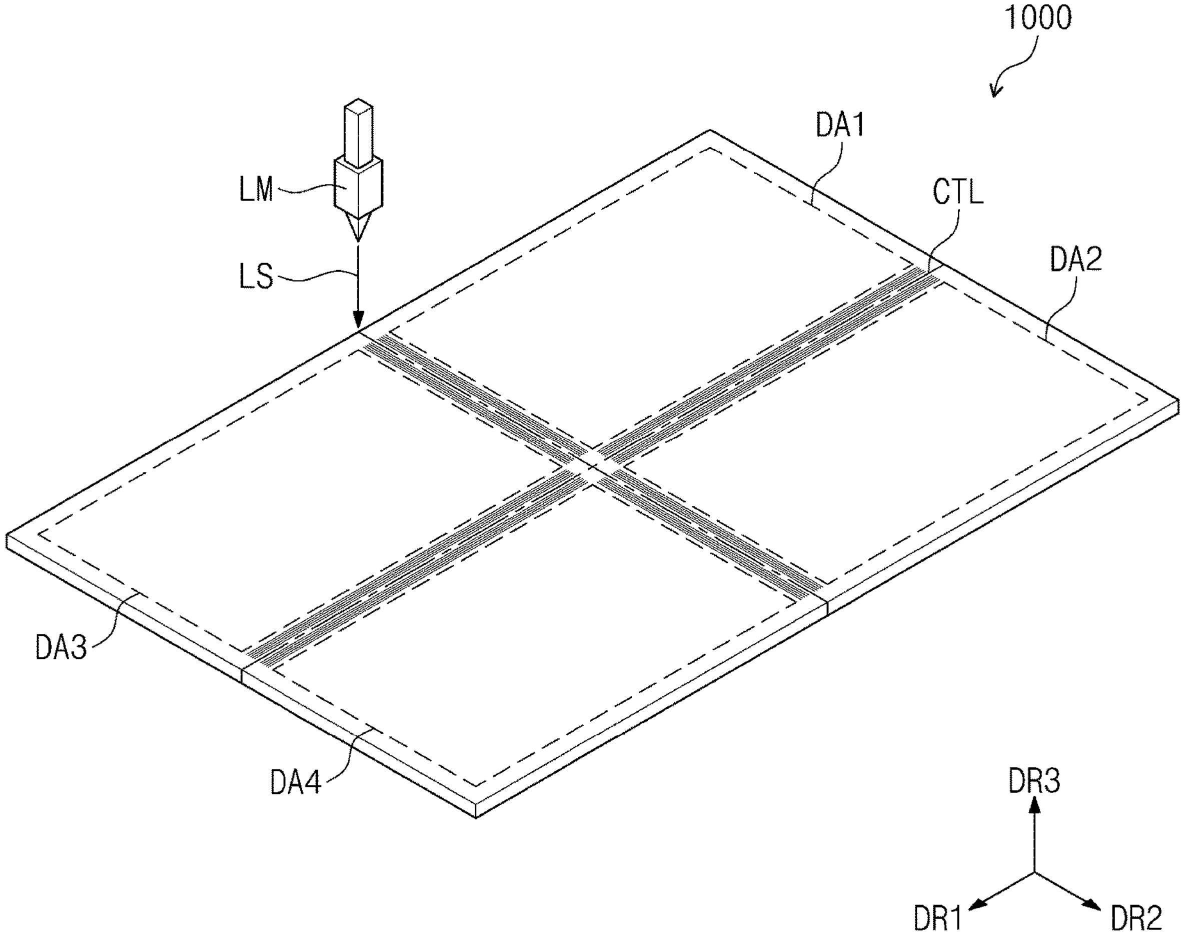
Figure 6C:
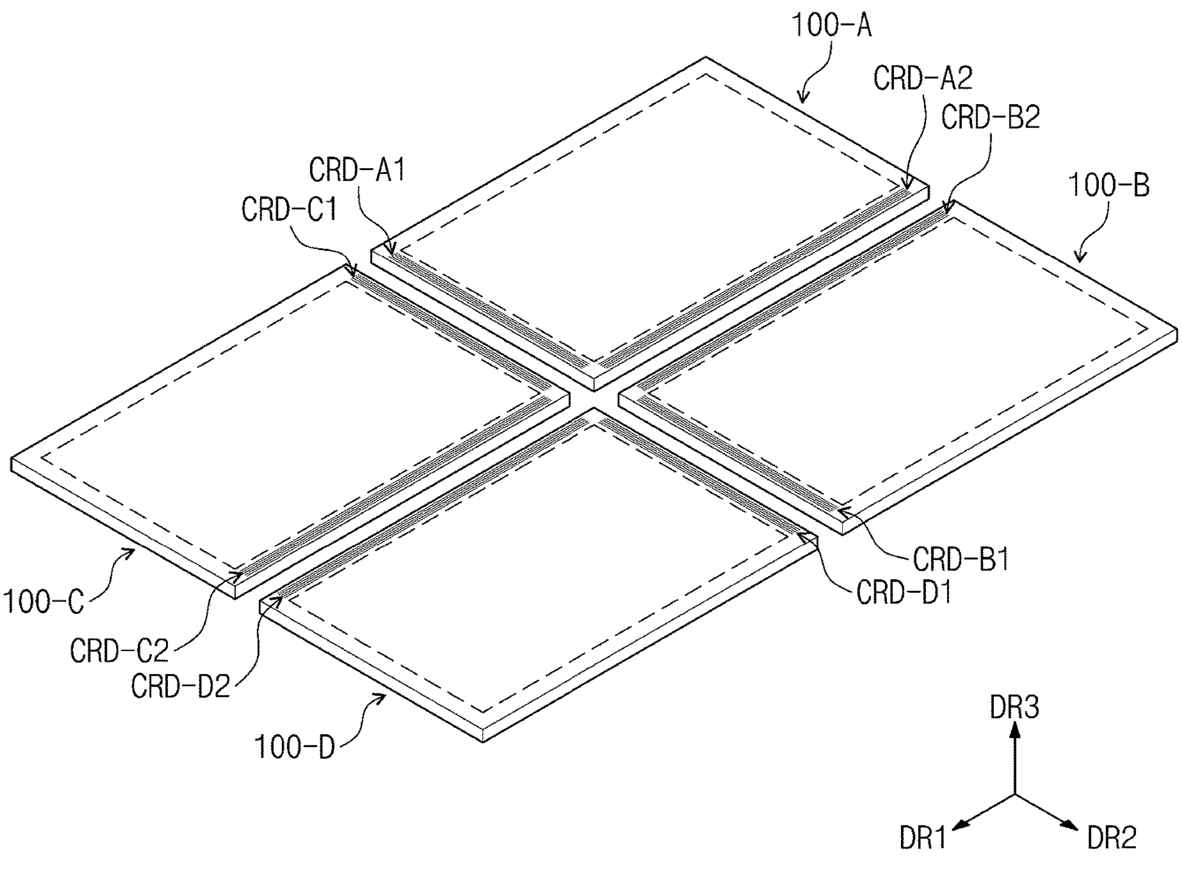
Figure 7A:
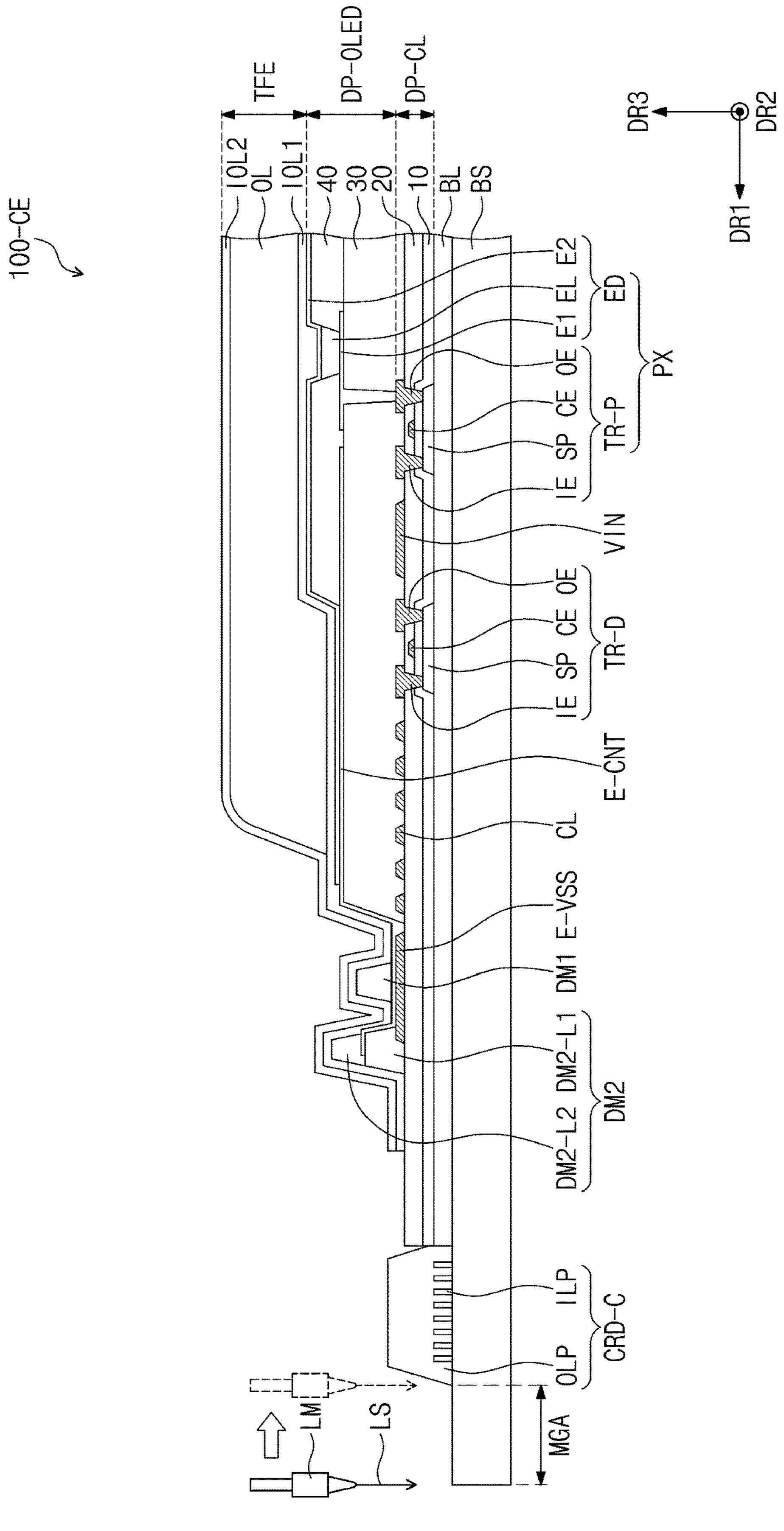
FIG. 7A is a sectional view illustrating a region of a display panel according to a comparative embodiment.
Figure 7B:
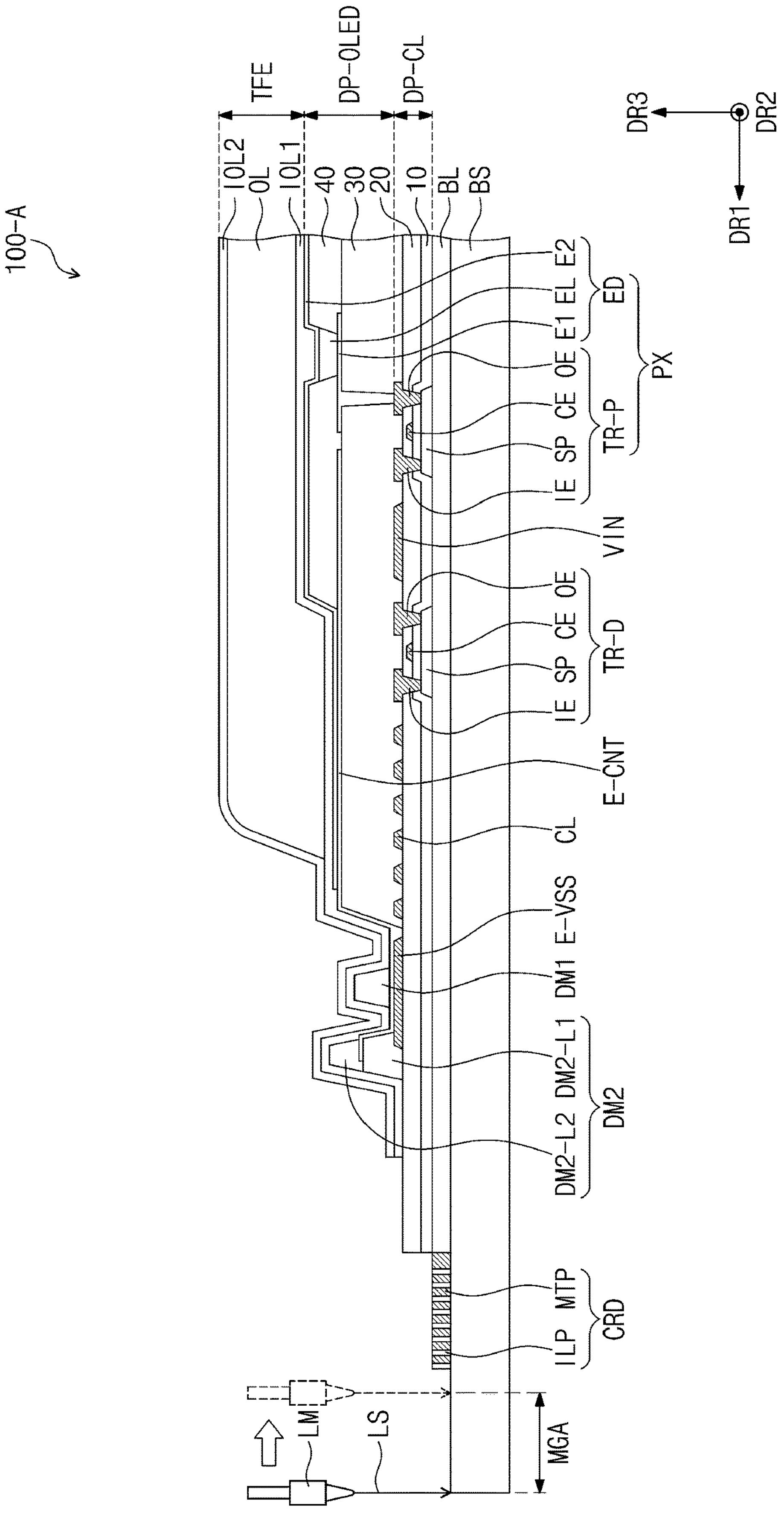
FIG. 7B is a sectional view illustrating a region of a display panel according to an embodiment of the inventive concept.

FIGS. 6A to 6C are schematic perspective views illustrating a method of fabricating a display panel according to an embodiment of the inventive concept. FIG. 7A is a sectional view illustrating a region of a display panel according to a comparative embodiment, and FIG. 7B is a sectional view illustrating a region of a display panel according to an embodiment of the inventive concept.

A step of forming a plurality of display panels 100-A, 100-B, 100-C, and 100-D from a mother substrate 1000 may be briefly illustrated in FIGS. 6A to 6C. FIG. 7A illustrates a region corresponding to the region shown in FIG. 2B, and FIG. 7B is a sectional view illustrating the display panel 100-A, which is one of the display panels 100-A, 100-B, 100-C, and 100-D of FIG. 6C. Hereinafter, some display panels will be described with reference to FIGS. 6A to 7B. For concise description, an element previously described with reference to FIGS. 1 to 5C may be identified by the same reference number without repeating an overlapping description thereof.

As shown in FIG. 6A, the mother substrate 1000 may include a plurality of crack dams CRD-A1, CRD-A2, CRD-B1, CRD-B2, CRD-C1, CRD-C2, CRD-D1, and CRD-D2, which are adjacent to a plurality of display regions DA1, DA2, DA3, and DA4. Each of the display regions DA1, DA2, DA3, and DA4 may correspond to the display region DA (e.g., see FIG. 1) described above. The display regions DA1, DA2, DA3, and DA4 may be formed by the same process.

Each of the crack dams CRD-A1, CRD-A2, CRD-B1, CRD-B2, CRD-C1, CRD-C2, CRD-D1, and CRD-D2 may be disposed on (e.g., adjacent to) a corresponding one of the display regions DA1, DA2, DA3, and DA4. In the present embodiment, a pair of crack dams may be disposed adjacent to each of the display regions DA1, DA2, DA3, and DA4.

A cutting line CTL may be defined between the display regions DA1, DA2, DA3, and DA4. For example, the cutting line CTL may be defined to determine the edge EG or the side surfaces of the insulating substrate BS (e.g., see FIG. 2B). The cutting line CTL may define edges of each of the display regions DA1, DA2, DA3, and DA4.

The crack dams CRD-A1, CRD-A2, CRD-B1, CRD-B2, CRD-C1, CRD-C2, CRD-D1, and CRD-D2 may be extended in an extension direction of the cutting line CTL adjacent thereto. The crack dams CRD-A1, CRD-A2, CRD-B1, CRD-B2, CRD-C1, CRD-C2, CRD-D1, and CRD-D2 may include first crack dams CRD-A1, CRD-B1, CRD-C1, and CRD-D1 extending in the second direction DR2 and second crack dams CRD-A2, CRD-B2, CRD-C2, and CRD-D2 extending in the first direction DR1. The cutting line CTL extending in the second direction DR2 may be positioned between two opposite ones of the first crack dams CRD-A1, CRD-B1, CRD-C1, and CRD-D1, and the cutting line CTL extending in the first direction DR1 may be positioned between two opposite ones of the second crack dams CRD-A2, CRD-B2, CRD-C2, and CRD-D2.

Thereafter, as shown in FIGS. 6B and 6C, the mother substrate 1000 may be cut along the cutting line CTL to form a plurality of display panels 100-A, 100-B, 100-C, and 100-D. The display regions DA1, DA2, DA3, and DA4 may be spaced apart from each other along the cutting line interposed therebetween.

The cutting of the mother substrate 1000 may be performed utilizing a laser module LM. The laser module LM may be configured to irradiate a laser beam LS onto the mother substrate 1000 along the cutting line CTL, and this irradiation process may be utilized to divide the mother substrate 1000 into the display panels 100-A, 100-B, 100-C, and 100-D, which include the display regions DA1, DA2, DA3, and DA4, respectively.

Here, when the mother substrate 1000 is cut along the cutting line CTL, impact may be exerted on each of the display regions DA1, DA2, DA3, and DA4. For example, impact may be transmitted from the cutting line CTL toward the display regions DA1, DA2, DA3, and DA4. However, according to an embodiment of the inventive concept, such a propagation of the impact may be prevented or reduced by the crack dams CRD-A1, CRD-A2, CRD-B1, CRD-B2, CRD-C1, CRD-C2, CRD-D1, and CRD-D2 formed along the cutting line CTL. Thus, it may be possible to prevent or substantially prevent impact, which may occur along the cutting line CTL during the cutting process, or the consequent crack from being transferred or expanded to the display regions DA1, DA2, DA3, and DA4 and thereby to improve process reliability of the fabrication process.

According to an embodiment of the inventive concept, it may be possible to reduce an area of the peripheral or bezel region of each of the display panels 100-A, 100-B, 100-C, and 100-D. A comparative display panel 100-CE according to the comparative embodiment and the display panel 100-A will be compared with each other with reference to FIGS. 7A and 7B. As shown in FIG. 7B, the display panel 100-A is configured to have substantially the same features as those of the display panel 100 of FIG. 2B, and as shown in FIG. 7A, except for the difference associated with the structure of the crack dam CRD-C, the comparative display panel 100-CE is configured to have substantially the same features as those of the display panel 100-A.

As shown in FIG. 7A, in the comparative display panel 100-CE according to the comparative embodiment, the crack dam CRD-C may include inorganic insulating patterns ILP and an organic insulating pattern OLP. The inorganic insulating patterns ILP may be covered with the organic insulating pattern OLP.

To reduce a width of a margin region MGA defined between the crack dam CRD-C and the end portion of the insulating substrate BS, the laser beam LS from the laser module LM may be irradiated onto a region close to the crack dam CRD-C, as depicted by the arrow. In this case, the organic insulating pattern OLP may be easily damaged by the laser beam LS. Furthermore, if the laser beam LS is irradiated onto the organic insulating pattern OLP, a contamination material such as carbide may be easily produced from a portion of the organic insulating pattern OLP. Thus, in the comparative display panel 100-CE, in order to prevent or substantially prevent the organic insulating pattern OLP from being damaged, the margin region MGA should be disposed to have a sufficiently large width.

By contrast, as shown in FIG. 7B, the crack dam CRD of the display panel 100-A may include the conductive patterns MTP, instead of the organic insulating pattern OLP. The inorganic insulating patterns ILP may be covered with the conductive patterns MTP, and the gap regions between the inorganic insulating patterns ILP may be filled with the conductive patterns MTP.

In the case where, as depicted by the arrow, the laser beam LS from the laser module LM is irradiated onto a region adjacent to the crack dam CRD to reduce a width of the margin region MGA, the conductive patterns MTP of the display panel 100-A may have a relatively high resistance to the laser beam LS, compared with the organic insulating pattern OLP. Accordingly, even when the laser beam LS is irradiated onto a region adjacent to the crack dam CRD, it may be possible to stably maintain the crack dam CRD. Thus, the cutting process may be performed so as to effectively reduce the width of the margin region MGA, and this may allow the display panel 100-A to have a narrow bezel region, compared with the comparative display panel 100-CE.

According to an embodiment of the inventive concept, since the gap regions between the inorganic insulating patterns ILP are filled with the conductive patterns MTP, it may be possible to prevent or substantially prevent a contamination material (e.g., dust or particles), which is produced from the insulating substrate BS in the cutting process utilizing the laser beam LS, from entering the gap regions between the inorganic insulating patterns ILP. Thus, it may be possible to improve process reliability in a process of fabricating the display panel.

FIGS. 8A to 8F are sectional views illustrating a method of fabricating a display panel according to an embodiment of the inventive concept. For convenience in illustration, each of FIGS. 8A to 8F is prepared to illustrate a region corresponding to the region shown in FIG. 2B. Hereinafter, a method of fabricating a display panel according to an embodiment of the inventive concept will be described with reference to FIGS. 8A to 8F.

Figure 8A:
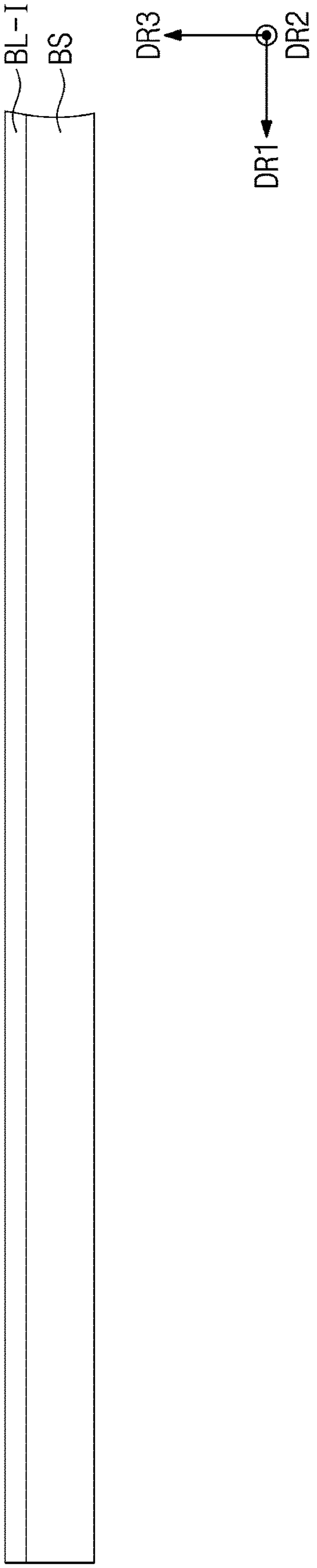
FIGS. 8A to 8F are sectional views illustrating a method of fabricating a display panel according to an embodiment of the inventive concept.

As shown in FIG. 8A, an initial base layer BL-I may be formed on the insulating substrate BS. The initial base layer BL-I may be formed of or include an insulating material. The initial base layer BL-I may be formed of an inorganic material and may be formed by a deposition process.

Figure 8B:
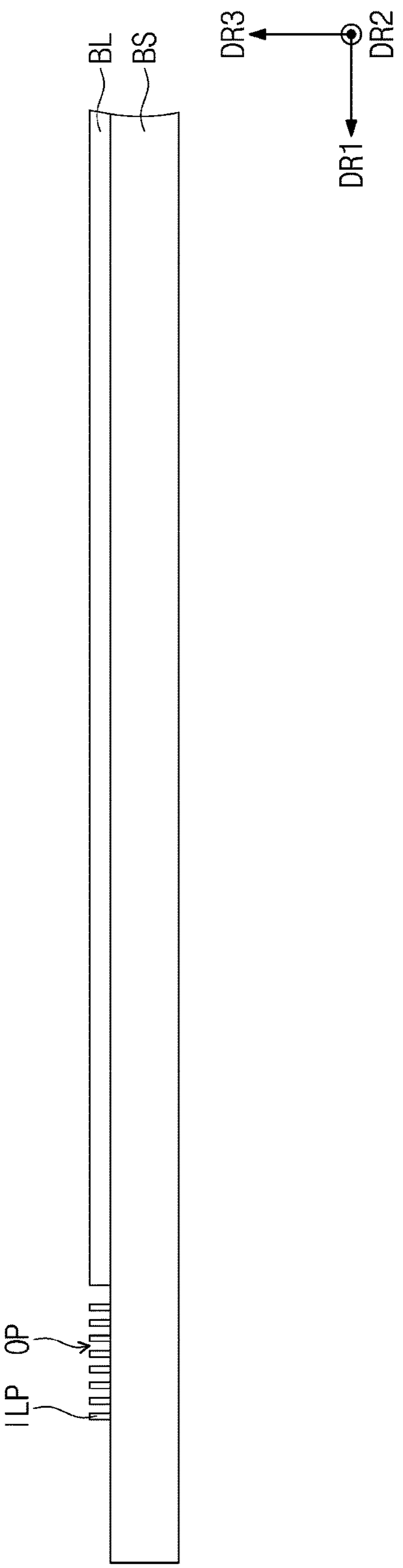

As shown in FIG. 8B, the initial base layer BL-I may be patterned to form the base layer BL and a plurality of the inorganic insulating patterns ILP. The inorganic insulating patterns ILP may be spaced apart from each other to form gap regions OP.

Figure 8C:
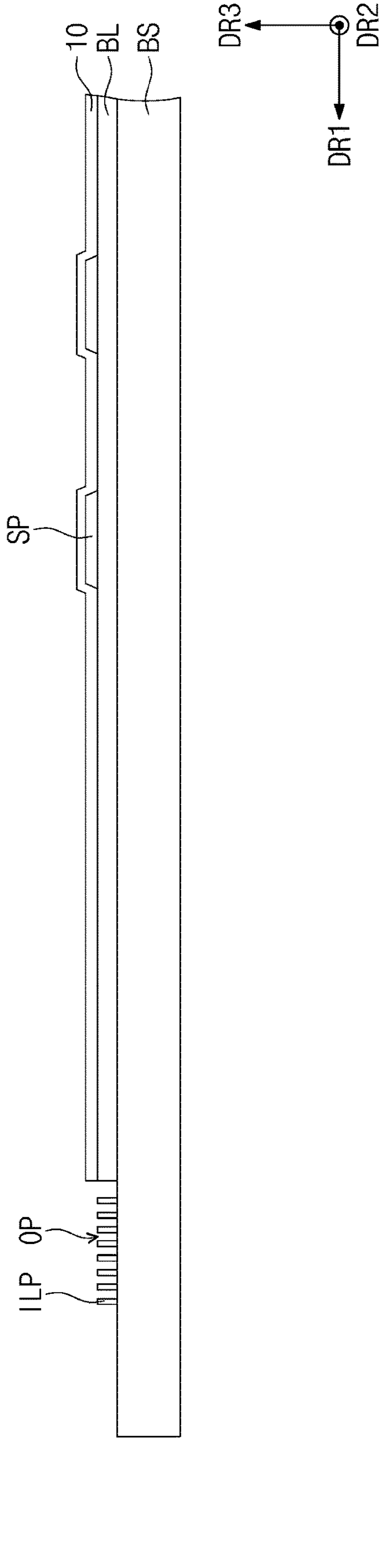

As shown in FIG. 8C, the semiconductor pattern SP and the first insulating layer 10 may be formed on the base layer BL. The semiconductor pattern SP may be formed by patterning a semiconductor material. The first insulating layer 10 may be disposed on the base layer BL to cover the semiconductor pattern SP. The first insulating layer 10 may be formed to be spaced apart from the inorganic insulating patterns ILP, when viewed in a plan view. The first insulating layer 10 may be formed of an inorganic material and may be formed by a deposition process.

Figure 8D:
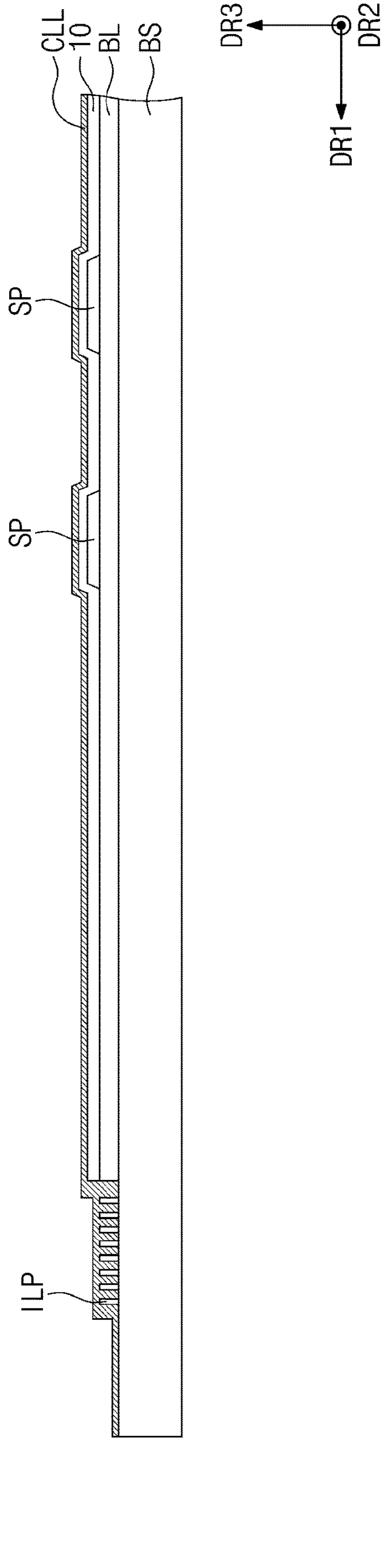
Figure 8E:
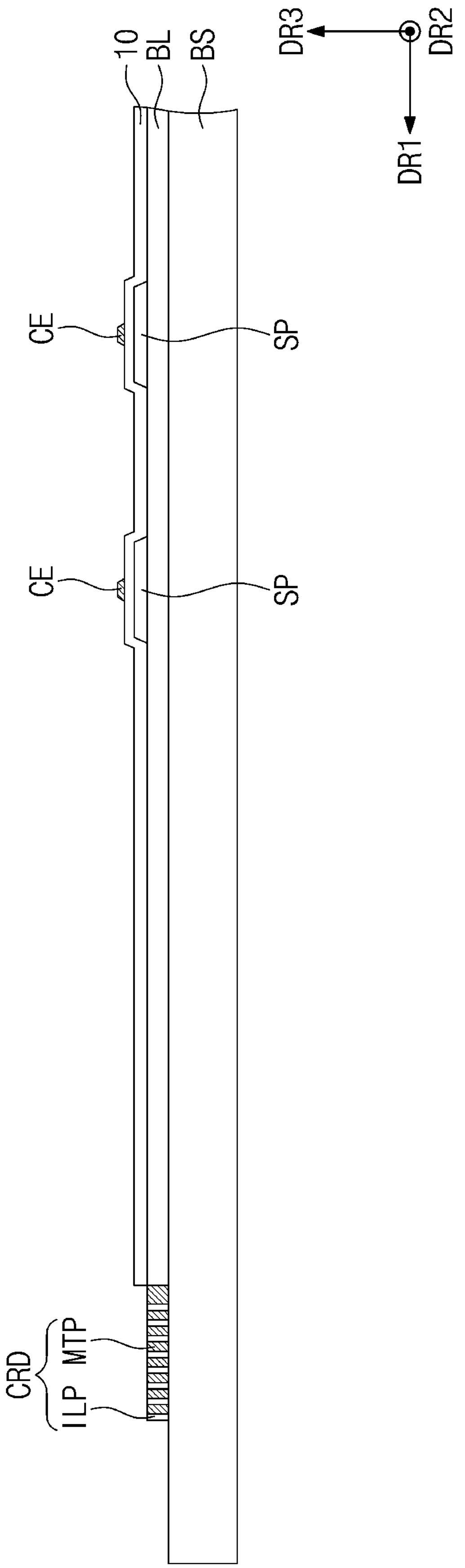

As shown in FIGS. 8D and 8E, a conductive layer CLL may be formed on the first insulating layer 10 and may be patterned to form the control electrode CE and a plurality of the conductive patterns MTP. The conductive layer CLL may be formed to cover the first insulating layer 10 and the inorganic insulating patterns ILP. The conductive layer CLL may be formed by depositing or coating a conductive material on the first insulating layer 10.

The control electrode CE and the conductive patterns MTP may be formed concurrently (e.g., simultaneously) by the same process. For example, the control electrode CE and the conductive patterns MTP may be formed utilizing a single common mask. The conductive patterns MTP may be formed of the same material as the control electrode CE and may have the same layered structure as the control electrode CE.

The conductive patterns MTP, in conjunction with the inorganic insulating patterns ILP, may constitute the crack dam CRD. In an embodiment, since the crack dam CRD is formed utilizing the same process as that for forming the base layer BL or the control electrode CE, it may be possible to easily form the crack dam CRD without adding a mask or a process step. This may make it possible to simplify the fabrication process and to reduce the process cost.

Figure 8F:
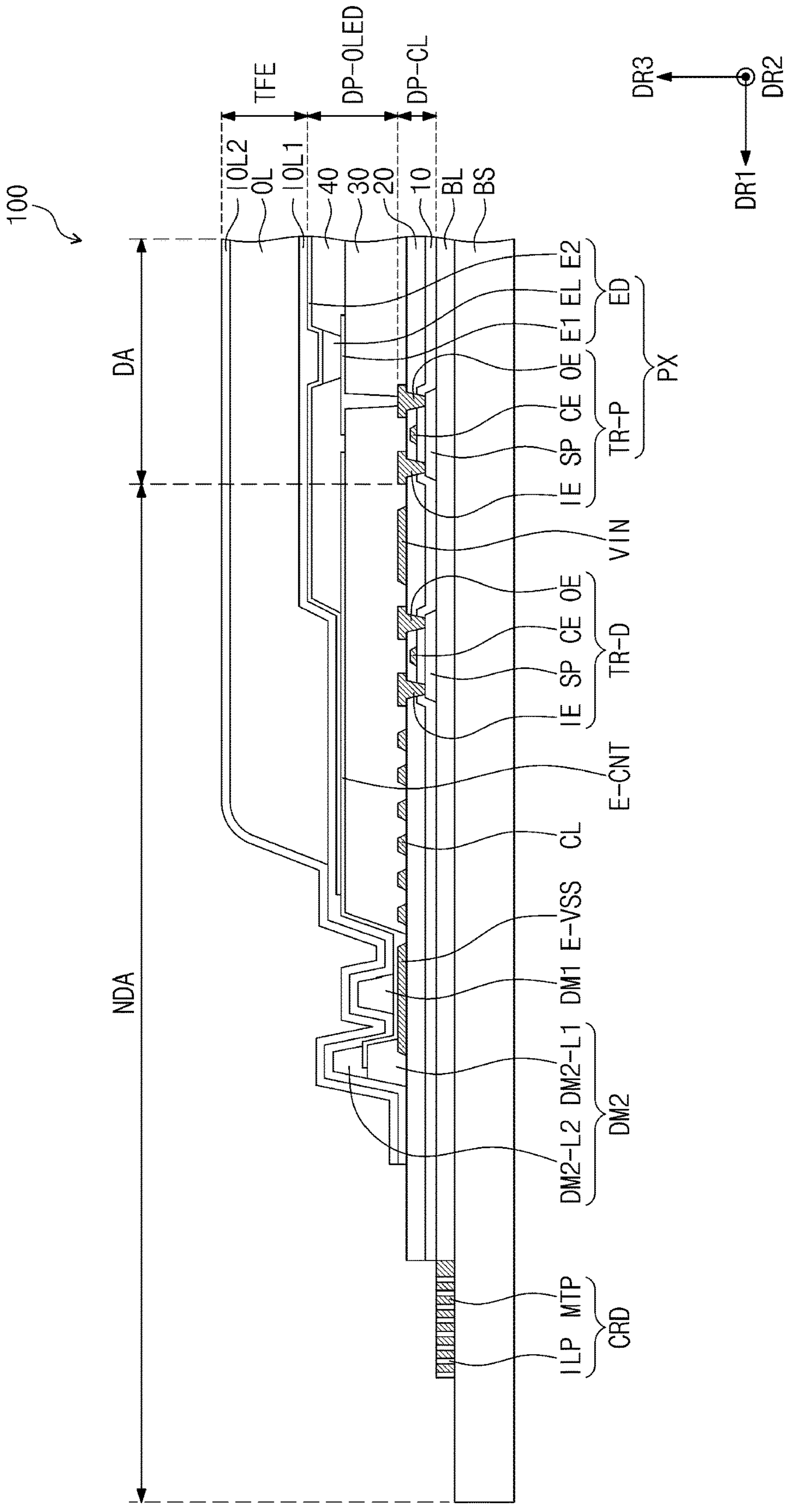

Thereafter, as shown in FIG. 8F, the circuit layer DP-CL, the display device layer DP-OLED, and the encapsulation layer TFE may be sequentially formed to form the display panel 100. Each of the circuit layer DP-CL, the display device layer DP-OLED, and the encapsulation layer TFE may be formed by one of the known technologies, and a detailed description thereof will be omitted.

As described above, the gap regions OP between the inorganic insulating patterns ILP may be filled with the conductive patterns MTP, before the formation of the circuit layer DP-CL, the display device layer DP-OLED, and the encapsulation layer TFE. Thus, even if a contamination material remains in the gap regions OP between the inorganic insulating patterns ILP, it may be possible to prevent or substantially prevent elements of the display panel from being damaged by the contamination material, because the remaining contamination material is covered with the conductive patterns MTP when the circuit layer DP-CL, the display device layer DP-OLED, and the encapsulation layer TFE are formed. This may make it possible to improve process reliability of the fabrication process.

Furthermore, as described above, because an existing process of forming a cell is utilized to form the cell as well as the crack dam CRD, it is unnecessary to perform an additional process for forming the crack dam CRD. This may make it possible to simplify the fabrication process and to reduce the process cost.

FIGS. 9A to 9F are sectional views illustrating a method of fabricating a display panel according to an embodiment of the inventive concept. For convenience in illustration, each of FIGS. 9A to 9F is prepared to illustrate a region corresponding to the region shown in FIG. 4A. Hereinafter, a method of fabricating a display panel (i.e., the display panel 100-1 of FIG. 4A) according to an embodiment of the inventive concept will be described with reference to FIGS. 9A to 9F.

Figure 9A:
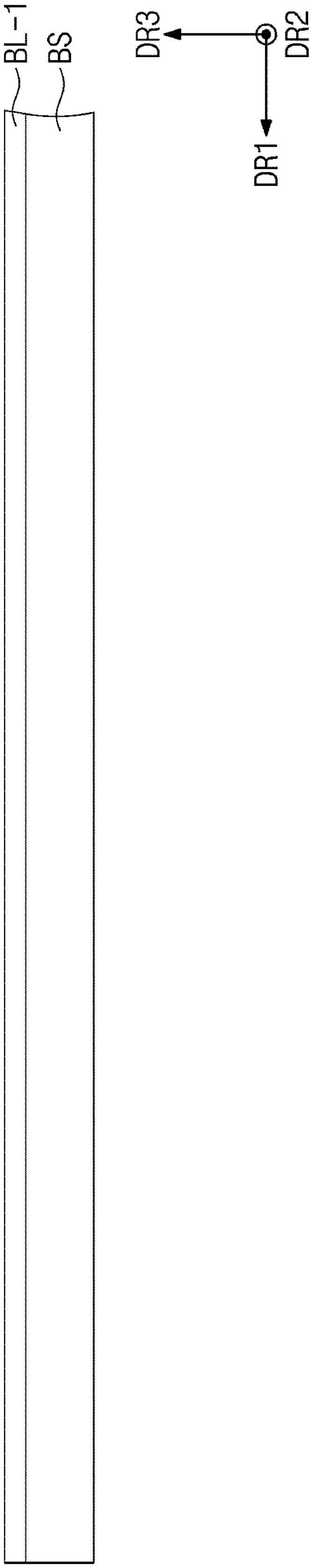
FIGS. 9A to 9F are sectional views illustrating a method of fabricating a display panel according to an embodiment of the inventive concept.

As shown in FIG. 9A, the base layer BL-1 may be formed on the insulating substrate BS. The base layer BL-1 may be formed by depositing an inorganic material on the insulating substrate BS. The base layer BL-1 may be formed by substantially the same method as that for forming the initial base layer BL-I of FIG. 8A.

Figure 9B:
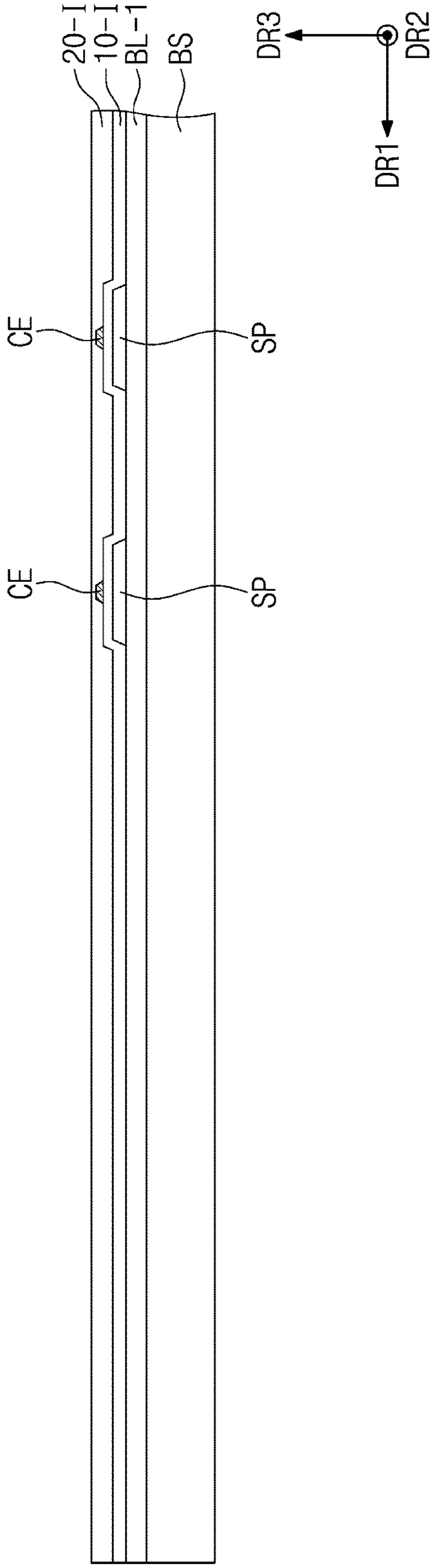

Thereafter, as shown in FIG. 9B, the semiconductor pattern SP, an initial first insulating layer 10-I, the control electrode CE, and an initial second insulating layer 20-I may be sequentially formed on the base layer BL-1. The semiconductor pattern SP may be formed by pattering a semiconductor material.

The initial first insulating layer 10-I may be formed on the base layer BL-1 to cover the semiconductor pattern SP. The initial first insulating layer 10-I may be formed to cover substantially the entire top surface of the base layer BL-1. The initial first insulating layer 10-I may be formed by depositing an inorganic material on the base layer BL-1.

The control electrode CE may be formed on the initial first insulating layer 10-I. The control electrode CE may be formed by depositing and patterning a conductive material. The control electrode CE may be formed by substantially the same method as that of FIG. 8B.

The initial second insulating layer 20-I may be formed on the initial first insulating layer 10-I to cover the control electrode CE. The initial second insulating layer 20-I may be formed to cover substantially the entire top surface of the initial first insulating layer 10-I. The initial second insulating layer 20-I may be formed by depositing an inorganic material on the initial first insulating layer 10-I.

Figure 9C:
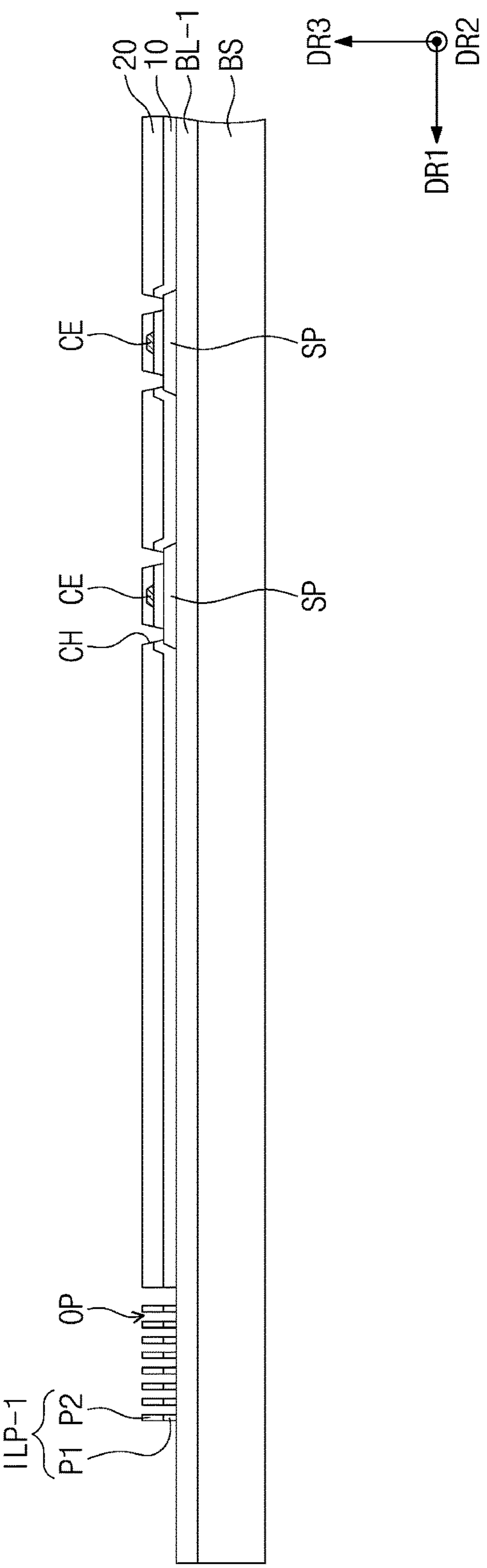

Next, as shown in FIG. 9C, the initial first insulating layer 10-I and the initial second insulating layer 20-I may be patterned to form the inorganic insulating patterns ILP-1, the first insulating layer 10, and the second insulating layer 20. The first and second insulating layers 10 and 20 may be formed by forming contact holes CH in the initial first insulating layer 10-I and the initial second insulating layer 20-I.

The inorganic insulating patterns ILP-1 may be formed to be spaced apart from each other with the gap regions OP interposed therebetween. The inorganic insulating patterns ILP-1 may include the first layers P1, which are formed from the initial first insulating layer 10-I, and the second layers P2, which are formed from the initial second insulating layer 20-I.

The inorganic insulating patterns ILP-1 and the first and second insulating layers 10 and 20 may be concurrently (e.g., simultaneously) formed through the same process. Thus, the gap regions OP and the contact holes CH may be concurrently (e.g., simultaneously) formed utilizing a single mask. In addition, the first layers P1 and the second layers P2 may be aligned to each other in the third direction DR3.

Figure 9D:
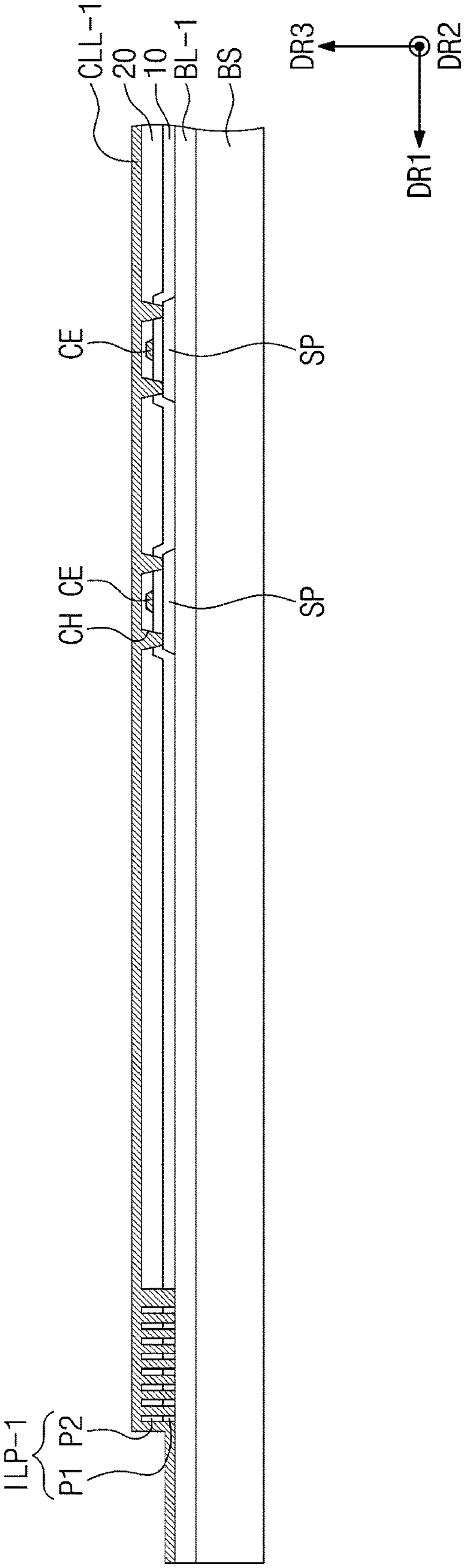
Figure 9E:
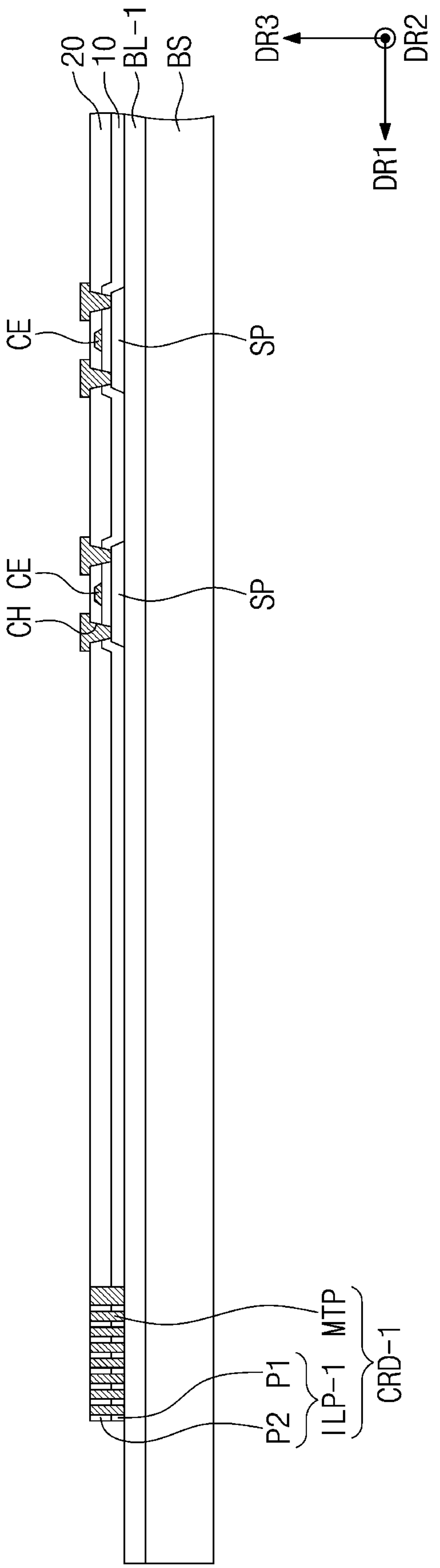

Thereafter, as shown in FIGS. 9D and 9E, a conductive layer CLL-1 may be formed on the second insulating layer 20 and then the conductive layer CLL-1 may be patterned to form the input electrode IE, the output electrode OE, and the conductive patterns MTP. The conductive layer CLL-1 may be formed by depositing or coating a conductive material on the second insulating layer 20. The conductive layer CLL-1 may be formed by forming a single layer or stacking a plurality of layers. The conductive layer CLL-1 may be formed to fill the gap regions OP and the contact holes CH.

The conductive layer CLL-1 may be patterned to form the input electrode IE, the output electrode OE, and the conductive patterns MTP. The input electrode IE, the output electrode OE, and the conductive patterns MTP may be concurrently (e.g., simultaneously) formed utilizing a single common mask. Thus, it may be possible to easily form the crack dam CRD-1, without an additional process for forming the conductive patterns MTP.

Figure 9F:
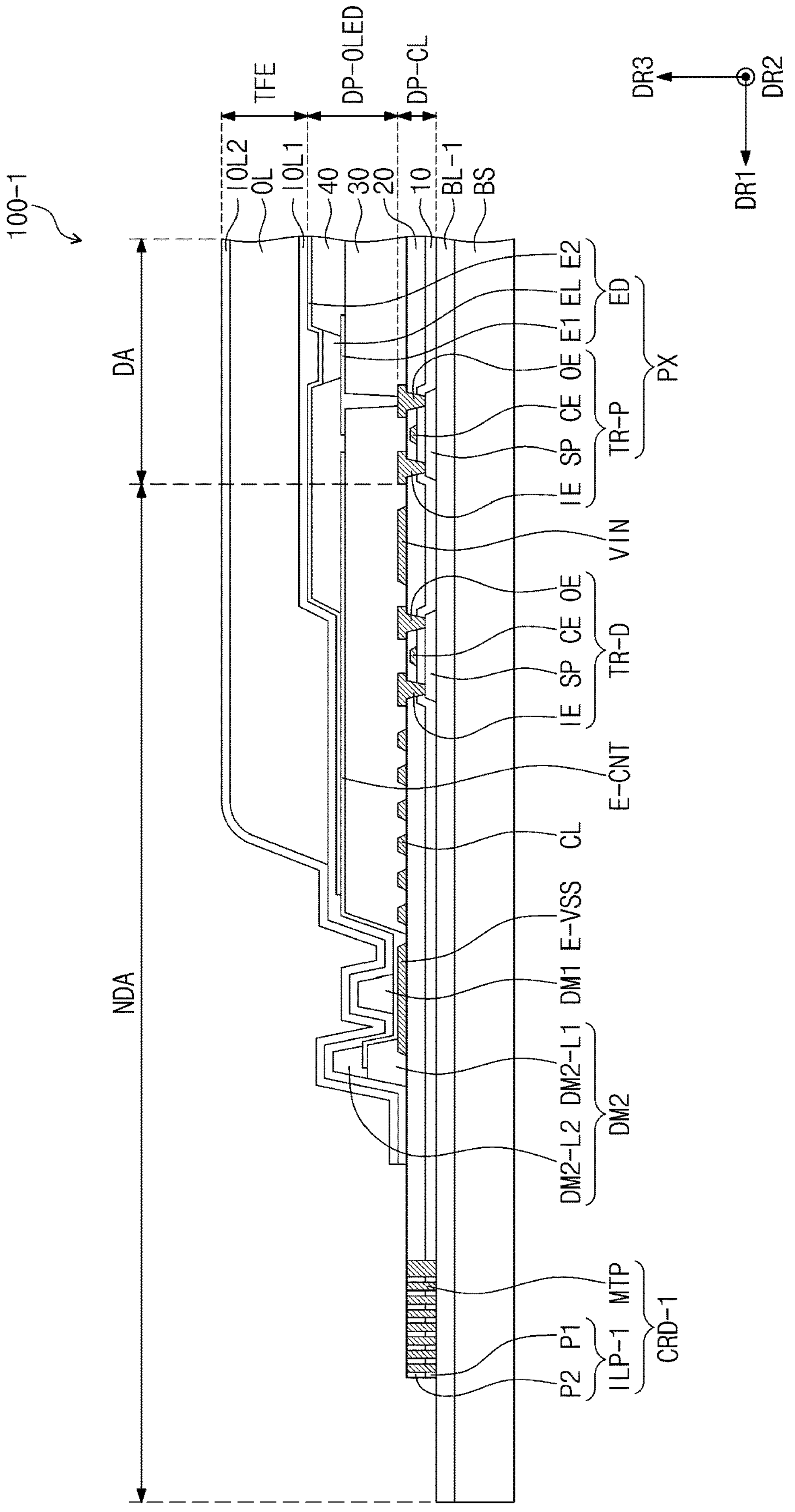

Next, as shown in FIG. 9F, the display device layer DP-OLED and the encapsulation layer TFE may be sequentially formed to form the display panel 100-1. Each of the display device layer DP-OLED and the encapsulation layer TFE may be formed by one of the known technologies, and a detailed description thereof will be omitted.

As described above, the gap regions OP between the inorganic insulating patterns ILP-1 may be filled with the conductive patterns MTP, before the formation of the display device layer DP-OLED. Thus, even if a contamination material remains in the gap regions OP between the inorganic insulating patterns ILP-1, it may be possible to prevent or substantially prevent elements of the display panel from being damaged by the contamination material, because the remaining contamination material is covered with the conductive patterns MTP when the display device layer DP-OLED or the encapsulation layer TFE are formed. This may make it possible to improve process reliability of the fabrication process.

Furthermore, as described above, because an existing process of forming a cell is utilized to form the cell as well as the crack dam CRD-1, it is unnecessary to perform an additional process for forming the crack dam CRD-1. This may make it possible to simplify the fabrication process and to reduce the process cost.

According to an embodiment of the inventive concept, a crack dam may be formed in a display panel to prevent or substantially prevent an impact, which is exerted to an outer portion of the display panel, from being transmitted to a display region. Accordingly, it may be possible to improve the reliability of a display device.

According to an embodiment of the inventive concept, because an organic pattern is omitted from the crack dam, it may be possible to prevent or substantially prevent a crack dam from being broken in a cutting process. Accordingly, it may be possible to reduce an area of a margin region for protecting the crack dam and thereby to reduce an area of a bezel region of display panel.

While example embodiments of the inventive concept have been particularly shown and described, it will be understood by one of ordinary skill in the art that variations in form and detail may be made therein without departing from the spirit and scope of the attached claims, and equivalents thereof.

What is claimed is:

1. A display panel, comprising:

an insulating substrate having a display region and a peripheral region adjacent to the display region;

a plurality of insulating layers on the insulating substrate;

a pixel on the display region, the pixel comprising a thin-film transistor and an organic light emitting device connected to the thin-film transistor; and a crack dam on the peripheral region and spaced apart from the pixel, the crack dam being adjacent to one of side surfaces of the insulating substrate extending in a first direction, wherein the crack dam comprises:

a plurality of insulating patterns extending in the first direction and spaced apart from each other in a second direction crossing the first direction; and a plurality of conductive patterns filling gap regions between the insulating patterns, and wherein the crack dam is electrically isolated from the thin-film transistor.

2. The display panel of claim 1, wherein the conductive patterns are extended in the first direction and spaced apart from each other in the second direction.

3. The display panel of claim 2, wherein each of the conductive patterns is configured to connect adjacent insulating patterns to each other.

4. The display panel of claim 1, wherein the thin-film transistor comprises:

a semiconductor pattern;

a control electrode spaced apart from the semiconductor pattern and overlapping the semiconductor pattern in a plan view;

an input electrode spaced apart from the control electrode in a plan view and coupled to a portion of the semiconductor pattern; and an output electrode spaced apart from the control electrode and coupled to an opposite portion of the semiconductor pattern, wherein the conductive patterns comprise a same material as at least one of the control electrode, the input electrode, and the output electrode.

5. The display panel of claim 4, wherein the insulating layers comprise:

a first insulating layer between the semiconductor pattern and the control electrode; and a second insulating layer between the control electrode and the input electrode, wherein the insulating patterns are on a same layer as at least one of the first insulating layer and the second insulating layer.

6. The display panel of claim 5, wherein each of the insulating patterns has a double-layered structure.

7. The display panel of claim 1, further comprising a base layer between the thin-film transistor and the insulating substrate, wherein the base layer comprises at least one of a barrier layer and a buffer layer, and the insulating patterns are on a same layer as the base layer.

8. The display panel of claim 7, wherein the insulating patterns are spaced apart from the base layer in the second direction.

9. The display panel of claim 8, wherein one of the conductive patterns is configured to connect one of the insulating patterns to the base layer.

10. The display panel of claim 7, wherein the insulating patterns are connected to at least a portion of the base layer.

11. The display panel of claim 1, wherein the insulating patterns comprise a plurality of first insulating patterns spaced apart from each other in the second direction, and a plurality of second insulating patterns spaced apart from each other in the second direction and located on a layer different from the first insulating patterns.

12. The display panel of claim 1, further comprising an encapsulation layer on the display region and configured to cover the pixel, wherein the encapsulation layer is extended to cover the crack dam and is in contact with the insulating patterns and the conductive patterns.

13. The display panel of claim 12, wherein each of the insulating patterns and the conductive patterns comprises an inorganic material.

14. A display panel, comprising:

an insulating substrate having a display region, a peripheral region adjacent to the display region, and a side surface extending in a first direction;

a pixel on the display region, the pixel comprising a thin-film transistor and an organic light emitting device connected to the thin-film transistor;

an encapsulation layer configured to cover the pixel and comprising an inorganic layer and an organic layer; and a crack dam on the peripheral region, adjacent to the side surface, and extending in the first direction, wherein the crack dam comprises:

a plurality of inorganic insulating patterns extending in the first direction and spaced apart from each other in a second direction crossing the first direction; and a plurality of conductive patterns between the inorganic insulating patterns, configured to connect adjacent inorganic insulating patterns to each other, and spaced apart from each other in the second direction.

15. The display panel of claim 14, wherein the inorganic layer of the encapsulation layer is configured to cover the crack dam, and the organic layer of the encapsulation layer is spaced apart from the crack dam, when viewed in a plan view.

16. The display panel of claim 15, wherein the inorganic insulating patterns comprise a plurality of insulating patterns on different layers, and the inorganic layer of the encapsulation layer has a stepwise shape on the crack dam.

* * * * *